United States Patent
Lee et al.

(10) Patent No.: US 12,500,560 B2
(45) Date of Patent: Dec. 16, 2025

(54) SEMICONDUCTOR DEVICE

(71) Applicant: Samsung Electronics Co., Ltd., Suwon-si (KR)

(72) Inventors: Donghan Lee, Busan (KR); Jee Weon Seo, Seoul (KR); Yong-Hun Kim, Seoul (KR)

(73) Assignee: Samsung Electro-Mechanics Co., Ltd.

( * ) Notice: Subject to any disclaimer, the term of this patent is extended or adjusted under 35 U.S.C. 154(b) by 501 days.

(21) Appl. No.: 17/989,211

(22) Filed: Nov. 17, 2022

(65) Prior Publication Data
US 2023/0318553 A1    Oct. 5, 2023

(30) Foreign Application Priority Data

Mar. 29, 2022   (KR) .................. 10-2022-0038828

(51) Int. Cl.
*H03F 3/45* (2006.01)
*G09G 3/20* (2006.01)

(52) U.S. Cl.
CPC .......... *H03F 3/45986* (2013.01); *G09G 3/20* (2013.01); *H03F 3/45475* (2013.01); *G09G 2310/027* (2013.01); *G09G 2310/0291* (2013.01); *G09G 2310/0294* (2013.01); *H03F 2203/45138* (2013.01)

(58) Field of Classification Search
CPC .............. G09G 2320/0276; G09G 2320/0673
See application file for complete search history.

(56) References Cited

U.S. PATENT DOCUMENTS

| | | | |
|---|---|---|---|
| 6,518,898 B1 | 2/2003 | Choksi | |
| 6,762,742 B2 * | 7/2004 | Moon | G09G 3/3406 |
| | | | 345/88 |
| 7,321,260 B2 | 1/2008 | Larson | |
| 7,479,937 B2 | 1/2009 | Shimoda | |
| 7,973,596 B2 * | 7/2011 | Eschauzier | H03F 3/45968 |
| | | | 330/9 |
| 8,736,642 B2 | 5/2014 | Ichikura et al. | |
| 11,276,370 B2 * | 3/2022 | Kim | G09G 5/18 |
| 12,159,567 B2 * | 12/2024 | Chang | G09G 3/2096 |

(Continued)

FOREIGN PATENT DOCUMENTS

| | | |
|---|---|---|
| JP | 2013/172398 A | 9/2013 |
| KR | 2010/0078386 A | 7/2010 |

*Primary Examiner* — William Boddie
*Assistant Examiner* — Bipin Gyawali
(74) *Attorney, Agent, or Firm* — Fish & Richardson P.C.

(57) ABSTRACT

In a semiconductor device, a first amplifier block operates in a holding mode for a first period to output a first tap voltage based on a first tap input voltage and an offset of a first gamma amplifier sampled. A second amplifier block operates in the holding mode during the first period to output a second tap voltage based on a second tap input voltage and an offset of a second gamma amplifier sampled. A third amplifier block operates in a sampling mode during the first period to sample an offset of a third gamma amplifier based on the second tap input voltage. Input terminal switches divide the first and second tap input voltages to the first to third amplifier blocks, and output terminal switches transmit the first tap voltage and the second tap voltage from at least some of the first to third amplifier block to a divider.

20 Claims, 20 Drawing Sheets

(56) References Cited

U.S. PATENT DOCUMENTS

| | | | |
|---|---|---|---|
| 2002/0149575 A1* | 10/2002 | Moon | G09G 3/3696 |
| | | | 345/204 |
| 2005/0057482 A1* | 3/2005 | Youngblood | G09G 3/3688 |
| | | | 345/100 |
| 2008/0191912 A1* | 8/2008 | Shin | H03M 1/667 |
| | | | 341/122 |
| 2010/0165006 A1* | 7/2010 | Son | G09G 5/10 |
| | | | 345/690 |
| 2021/0366344 A1* | 11/2021 | Chung | G09G 3/2007 |
| 2024/0135859 A1* | 4/2024 | Chang | G09G 3/2096 |
| 2024/0194163 A1* | 6/2024 | Kim | G09G 3/3688 |
| 2024/0428714 A1* | 12/2024 | Lee | G09G 3/20 |

\* cited by examiner

FIG. 6

|  | GAMP_A | GAMP_B | GAMP_C |
|---|---|---|---|
| 1st line | H1 | H3 | S3 |
| 2nd line | H1 | S1 | H3 |
| 3rd line | S3 | H1 | H3 |
| 4th line | H3 | H1 | S1 |
| 5th line | H3 | S3 | H1 |
| 6th line | S1 | H3 | H1 |
| 7th line | H1 | H3 | S3 |

2 lines hold

FIG. 9

|  | GAMP_A | GAMP_B | GAMP_C |
|---|---|---|---|
| 1st line | H1 | H2 | S2 |
| 2nd line | H1 | S1 | H2 |
| 3rd line | S2 | H1 | H2 |
| 4th line | H2 | H1 | S1 |
| 5th line | H2 | S2 | H1 |
| 6th line | S1 | H2 | H1 |
| 7th line | H1 | H2 | S2 |

2 lines hold

FIG. 13

|  | GAMP_A | GAMP_B | GAMP_C |
|---|---|---|---|
| 1st line | H1 | H3 | S3 |
| 2nd line | H1 | S3 | H3 |
| 3rd line | H1 | H3 | S1 |
| 4th line | S1 | H3 | H1 |
| 5th line | H1 | H3 | S3 |
| 6th line | H1 | S3 | H3 |
| 7th line | H1 | H3 | S1 |

3 lines hold

FIG. 16

|  | GAMP_A | GAMP_B | GAMP_C |
|---|---|---|---|
| 1st line | H1 | H2 | S2 |
| 2nd line | H1 | S2 | H2 |
| 3rd line | H1 | H2 | S1 |
| 4th line | S1 | H2 | H1 |
| 5th line | H1 | H2 | S2 |
| 6th line | H1 | S2 | H2 |
| 7th line | H1 | H2 | S1 |

3 lines hold

FIG. 18

| | Offset (1-sigma) | Power Consumption | Area | # of GAMP / AZ Cap / AZ SW | Holding : Sampling period ratio | # of OUT SW | Remarks |
|---|---|---|---|---|---|---|---|
| Ping-pong AZ | 0.1 mV | 100 % | 100 % | 2N | 1 : 1 | 2N / 2N+1 | - |
| Circulated AZ1 | 0.1 mV | 67 % | 73 % | N+1 | N : 1 | (N+1)*N / (N+1)*N+1 | Shorter hold mode and more SWs compared to AZ2 |
| Circulated AZ2 | 0.1 mV | 67 % | 68 % | N+1 | 2N-1 : 1 | 2N / 2N+1 | Longer hold mode and fewer SWs compared to AZ1 |

SEMICONDUCTOR DEVICE

CROSS-REFERENCE TO RELATED APPLICATION

This application claims priority to and the benefit of Korean Patent Application No. 10-2022-0038828 filed in the Korean Intellectual Property Office on Mar. 29, 2022, the entire contents of which are incorporated herein by reference.

BACKGROUND

Various example embodiments relate to a semiconductor device.

A display panel provides various visual information to users through images, and a color and/or resolution expressed to provide better image quality are constantly evolving. A display driver integrated circuit (DDI) is used to implement a screen on the display panel.

The DDI is or includes a semiconductor device that drives pixels configuring the display panel. The pixel may include, for example, sub-pixels that display red, green, and blue (RGB), and the DDI may transmit a signal to a thin film transistor (TFT) in order to allow the TFT to drive the sub-pixels. The DDI is largely classified into a mobile DDI and a medium-large DDI, and it commonly includes a gate driver for turning on/off the sub-pixels and a source driver for realizing a difference in color expressed by the sub-pixels.

SUMMARY

Some example embodiments provide a semiconductor device that may output a gray voltage.

According to some example embodiments, a semiconductor device includes a first amplifier block that includes a first gamma amplifier and is configured to operate in a holding mode for a first period of a plurality of periods to output a first tap voltage based on a first tap input voltage and an offset of the first gamma amplifier sampled; a second amplifier block that includes a second gamma amplifier that is configured to operate in the holding mode during the first period to output a second tap voltage based on a second tap input voltage and an offset of the second gamma amplifier sampled; a third amplifier block that includes a third gamma amplifier and that is configured to operate in a sampling mode during the first period to sample an offset of the third gamma amplifier based on the second tap input voltage; a plurality of input terminal switches that are configured to divide the first tap input voltage and the second tap input voltage to the first amplifier block, the second amplifier block, and the third amplifier block; and a plurality of output terminal switches that are configured to transmit the first tap voltage and the second tap voltage from at least some of the first amplifier block, the second amplifier block, and the third amplifier block to a divider.

According to some example embodiments, a semiconductor device includes a plurality of amplifier blocks configured to operate in a holding mode that outputs a tap voltage based on a tap input voltage and an offset of a gamma amplifier sampled or in a sampling mode that samples the offset of the gamma amplifier based on the tap input voltage; and a driving controller that is configured to control an operation mode of the plurality of amplifier blocks. The driving controller, during a first period of a plurality of periods and during a second period after the first period, is configured to maintain an operation of a first amplifier block of the plurality of amplifier blocks in the holding mode, and to alternately switch operations of a second amplifier block and a third amplifier block of the plurality of amplifier blocks in the holding mode and the sampling mode.

According to some example embodiments, a semiconductor device includes, in order to provide N tap voltages (N is a natural number equal to or greater than 2), N+1 amplifier blocks that are configured to operate in a holding mode that outputs a tap voltage based on a tap input voltage and an offset of a gamma amplifier sampled or in a sampling mode that samples the offset of the gamma amplifier based on the tap input voltage; a plurality of output terminal switches that transmit outputs of N amplifier blocks among the N+1 amplifier blocks to a divider; and a driving controller that is configured to control operation modes of the N+1 amplifier blocks so that, every plurality of periods, N amplifier blocks among the N+1 amplifier blocks operate in the holding mode and only one amplifier block thereof operates in the sampling mode. The amplifier blocks operating in the holding mode are different from each other during a first period of the plurality of periods and a second period after the first period.

BRIEF DESCRIPTION OF THE DRAWINGS

FIG. 6 illustrates a drawing for explaining an operation of a semiconductor device according to some example embodiments.

FIG. 9 illustrates a drawing for explaining an operation of a semiconductor device according to some example embodiments.

FIG. 13 illustrates a drawing for explaining an operation of a semiconductor device according to some example embodiments.

FIG. 16 illustrates a drawing for explaining an operation of a semiconductor device according to some example embodiments.

FIG. 17 and FIG. 18 illustrate drawings for explaining a semiconductor device according to embodiments.

DETAILED DESCRIPTION OF SOME EXAMPLE EMBODIMENTS

Figure 1:
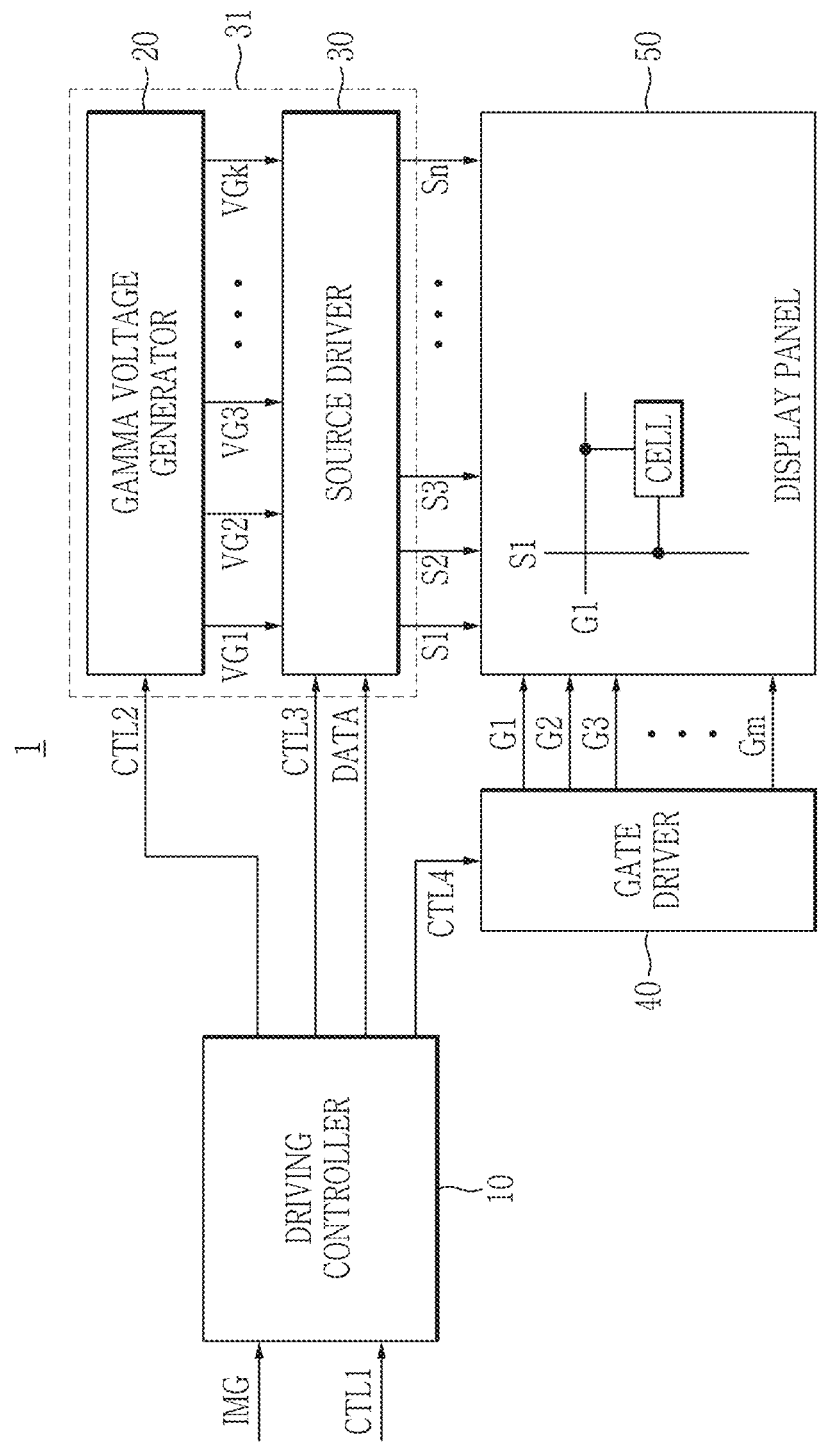
FIG. 1 illustrates a block diagram of a semiconductor device according to some example embodiments.

In the following detailed description, only certain example embodiments of the present invention have been shown and described, simply by way of illustration. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. The sequence of operations or steps is not limited to the order presented in the claims or figures unless specifically indicated otherwise. The order of operations or steps may be changed, several operations and/or steps may be merged, a certain operation or step may be divided, and a specific operation and/or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation.

FIG. 1 illustrates a block diagram of a semiconductor device according to some example embodiments.

Referring to FIG. 1, a semiconductor device 1 according to some example embodiments may include a driving controller 10, a gamma voltage generator 20, a source driver 30, a gate driver 40, and a display panel 50. Here, the driving controller 10, the gamma voltage generator 20, the source driver 30, and the gate driver 40 may be implemented as a semiconductor device that drive pixels configuring the display panel 50, for example, as a DDI.

The driving controller 10 may receive image data IMG from a host device and a driving control signal CTL1 from the host device, and may control the gamma voltage generator 20, the source driver 30, and the gate driver 40. Here, the host device may be or may include a computing device or system that controls the semiconductor device 1 to display an image desired by a user on the display panel 50 from the outside. In some example embodiments, the driving control signal CTL1 provided from the host device may include control instructions, dynamically determined and/or predetermined data, and the like for controlling the gamma voltage generator 20, the source driver 30, and the gate driver 40, and the driving controller 10 may control the gamma voltage generator 20, the source driver 30, and the gate driver 40 based on the driving control signal CTL1. In some example embodiments, the driving controller 10 may control the gamma voltage generator 20, the source driver 30, and the gate driver 40 based on a control instruction generated by itself, independent of the driving control signal CTL1 or in addition to the driving control signal CTL1.

The driving controller 10 may transmit a gamma voltage generating control signal CTL2 to the gamma voltage generator 20 to control an operation of the gamma voltage generator 20. For example, at least some of the gamma voltage generating control signals CTL2 may control an offset control switch inside an amplifier block including a gamma amplifier that is inside the gamma voltage generator 20 so that the amplifier block may sample the offset of the gamma amplifier, and/or at least some of the gamma voltage generating control signals CTL2 may control the gamma voltage generator 20 to output an input voltage not based on the above. As another example, at least some of the gamma voltage generating control signals CTL2 may control an input terminal switch and/or an output terminal switch operating before and after an amplifier block in the gamma voltage generator 20, so that it may control the gamma voltage generator 20 so that the gamma voltage generator 20 may output a voltage suitable for a purpose according to an operation mode of the amplifier block. Meanwhile, the driving controller 10 may transmit a source driver control signal CTL3 and a gate driver control signal CTL4 to the source driver 30 and the gate driver 40, for example, to perform control to synchronize the operations of the source driver 30 and the gate driver 40.

The gamma voltage generator 20 may receive the gamma voltage generating control signal CTL2 from the driving controller 10 to generate a plurality of gamma voltages VG1 to VGk (k is a natural number greater than or equal to one) to provide the plurality of gamma voltages VG1 to VGk to the source driver 30. The plurality of gamma voltages VG1 to VGk may have k different levels, and may each correspond to k different levels of a grayscale. For example, 256 gamma voltages VG1 to VG256 may be or may correspond to voltages corresponding to a 0 grayscale to a 255 grayscale. The plurality of gamma voltages VG1 to VGk may be provided to the source driver 30 to be used by the source driver 30 to adjust luminance of the pixels of the display panel 50. The gamma voltage may also or alternatively be referred to as a grayscale voltage.

The source driver 30 may receive the source driver control signal CTL3 and data DATA in a form of a digital signal from the driving controller 10, and may convert the data DATA in the form of the digital signal to an analog signal so that the analog signal may be displayed on the display panel 50. Here, the data DATA is or includes information data for displaying the image data IMG on the display panel 50, and may include, for example, red-green-blue (RGB) data. The converted analog signal may be referred to as a data signal, and may be transmitted to the display panel 50 through a plurality of source lines S1 to Sn (n is a natural number) according to the source driver control signal CTL3 provided from the driving controller 10. The source driver may also or alternatively be referred to as a data driver.

The gate driver 40 may receive the gate driver control signal CTL4 from the driving controller 10, and may sequentially drive a plurality of gate lines G1 to Gm (m is a natural number). For example, the gate driver 40 may sequentially provide a pulse signal to the plurality of gate lines G1 to Gm according to the gate driver control signal CTL4.

In some example embodiments, at least one of the gamma voltage generator 20, the source driver 30, and the gate driver 40 may be integrally formed with the driving controller 10. Alternatively or additionally, in some example embodiments, as indicated by reference numeral 31, the gamma voltage generator 20 and the source driver 30 may all be integrally formed. Meanwhile, in some example embodiments, the semiconductor device 1 may further include a DC/DC converter that provides a driving voltage to one or more of the gamma voltage generator 20, the source driver 30, and the gate driver 40.

The display panel 50 may include a plurality of pixels for displaying information data. The unit cell CELL may be connected between a corresponding source line S1 among the plurality of source lines S1 to Sn and a corresponding gate line G1 among the plurality of gate lines G1 to Gm. When a data signal in a form of an analog signal is input from the source driver 30 to the plurality of source lines S1 to Sn concurrently with or while a pulse signal is provided from the gate driver 40 to the plurality of gate lines G1 to Gm, information data may be displayed on the pixel of the display panel 50. More than one pixels may be combined to form one frame. The display panel 50 may be or may include an organic light emitting diode display panel including an organic light emitting diode and/or a liquid crystal panel including a liquid crystal.

Figure 2:
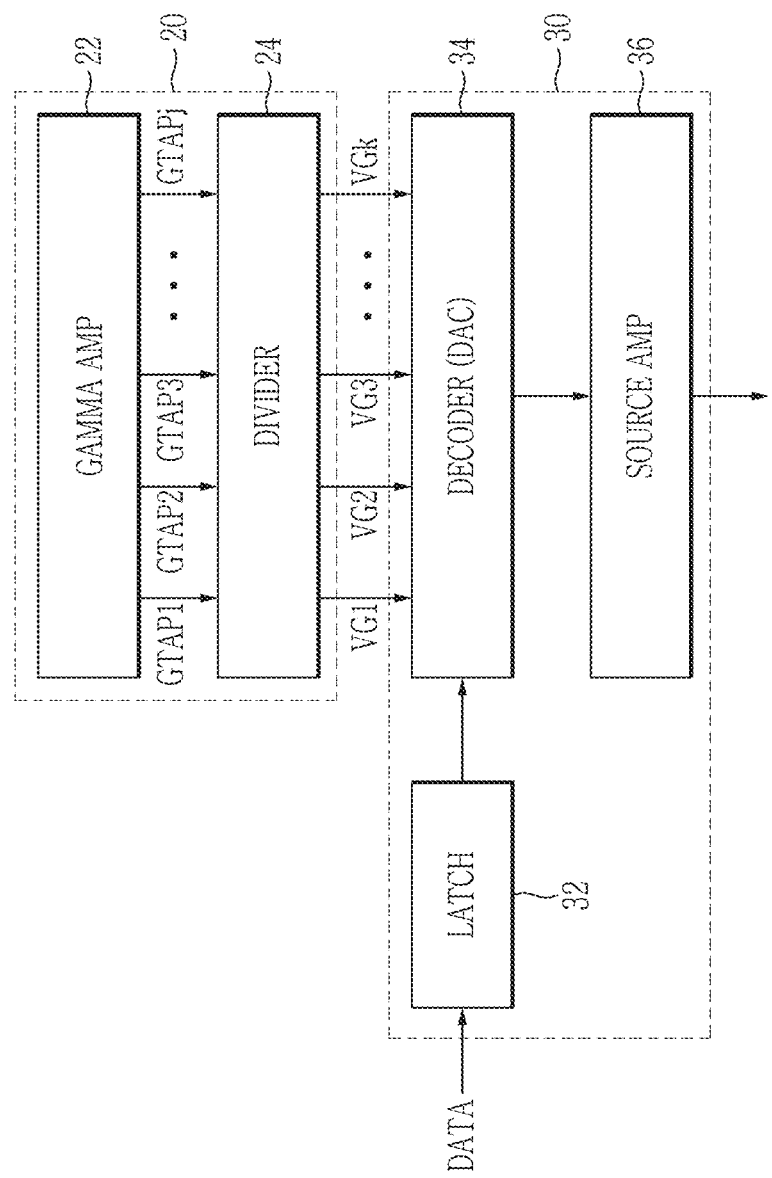
FIG. 2 illustrates a block diagram of a semiconductor device according to some example embodiments.

FIG. 2 illustrates a block diagram of a semiconductor device according to various example embodiments.

Referring to FIG. 2, in the semiconductor device according to some example embodiments, the gamma voltage generator 20 may include a gamma amplifier 22 and a divider 24, and the source driver 30 may include a latch 32, a decoder or digital to analog (D/A) converter DAC 34, and a source amplifier 36.

The gamma amplifier 22 may include a plurality of gamma amplifiers, and may provide a plurality of tap voltages GTAP1 to GTAPj (j is a natural number) output from the gamma amplifier to the divider 24. Here, the plurality of tap voltages GTAP1 to GTAPj may be set as reference voltage levels to generate the plurality of gamma voltages VG1 to VGk in the divider 24. For example, when k gamma voltages are required or used according to the implementation purpose, the plurality of tap voltages GTAP1 to GTAPj may be designed in an appropriate number to satisfy j<k in consideration of a resistor configuration included in the divider 24.

The divider 24 may be implemented as a resistor string including a plurality of resistors, and a plurality of taps VGMA1 to VGMAp (p is a natural number) to which the plurality of tap voltages GTAP1 to GTAPj provided from the gamma amplifier 22 are applied may be defined. Accordingly, when a tap voltage is applied to two taps VGMAq and VGMAr (q and r are natural numbers greater than or equal to one, and q<r<=p), a plurality of gamma voltages VG1 to VGk of which voltage level is determined according to a resistor configuration between the two taps VGMAq and VGMAr may be outputted. The plurality of gamma voltages VG1 to VGk that are output may be provided to the decoder 34 of the source driver 30.

The latch 32 may store, e.g. temporarily store the received data DATA (for example, RGB data), may dispose it to match the source line of the display panel 50, and may transmit the disposed data to the decoder 34.

The decoder 34 may receive the data DATA disposed to match the source line of the display panel 50 by the latch 32 to convert the data DATA from a digital signal to an analog signal. The decoder 34 may convert the digital signal data DATA into an analog signal by matching the plurality of gamma voltages VG1 to VGk received from the divider 24 of the gamma voltage generator 20 with the data DATA. The converted analog signal is transmitted to the source amplifier 36 to become an input signal for a plurality of source amplifiers provided in the source amplifier 36.

The source amplifier 36 may amplify the input signal received from the decoder 34 to generate an output signal, and the generated output signal may be transmitted to the display panel 50 through the plurality of source lines S1 to Sn.

As the number of grayscales applied to a high-definition display panel increases, a voltage difference between grayscales required or used for design may gradually decrease, and accordingly, the importance of designing to remove or reduce the offset of the gamma amplifier that affects accuracy of a grayscale value increases. Hereinafter, a semiconductor device according to various example embodiments for more accurately and/or more precisely outputting a subdivided grayscale voltage having a small voltage difference will be described.

Figure 3:
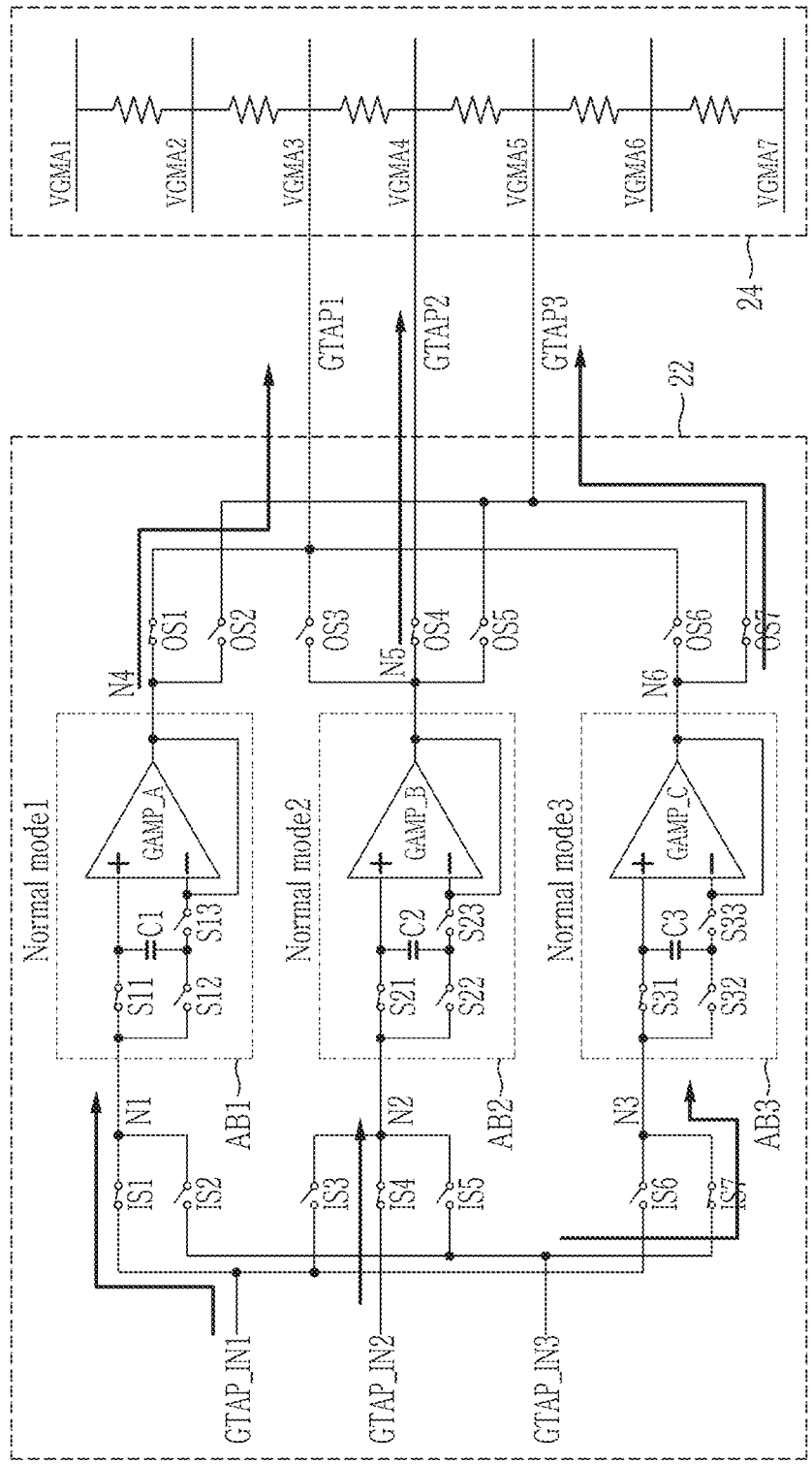
FIG. 3 to FIG. 5 illustrate circuit diagrams of a semiconductor device according to some example embodiments.
Figure 4:
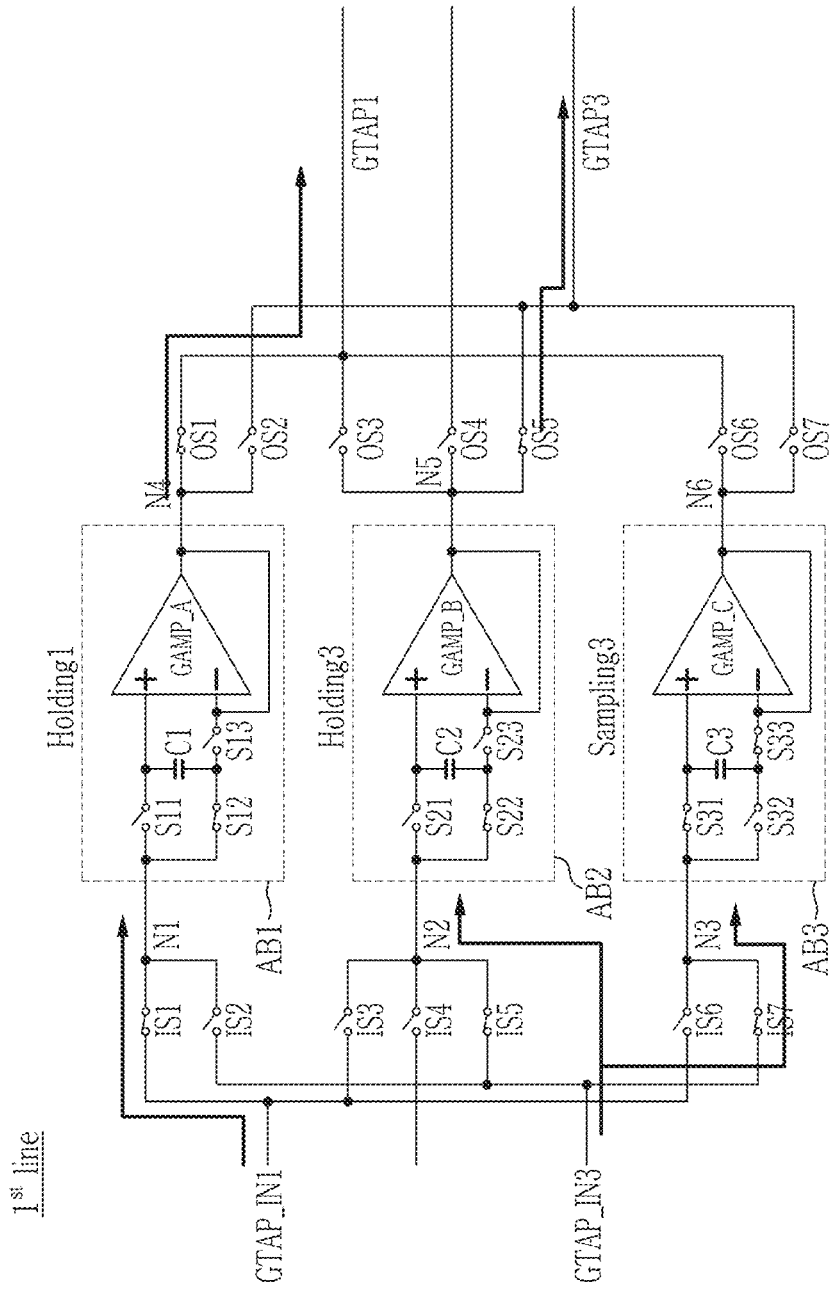
Figure 5:
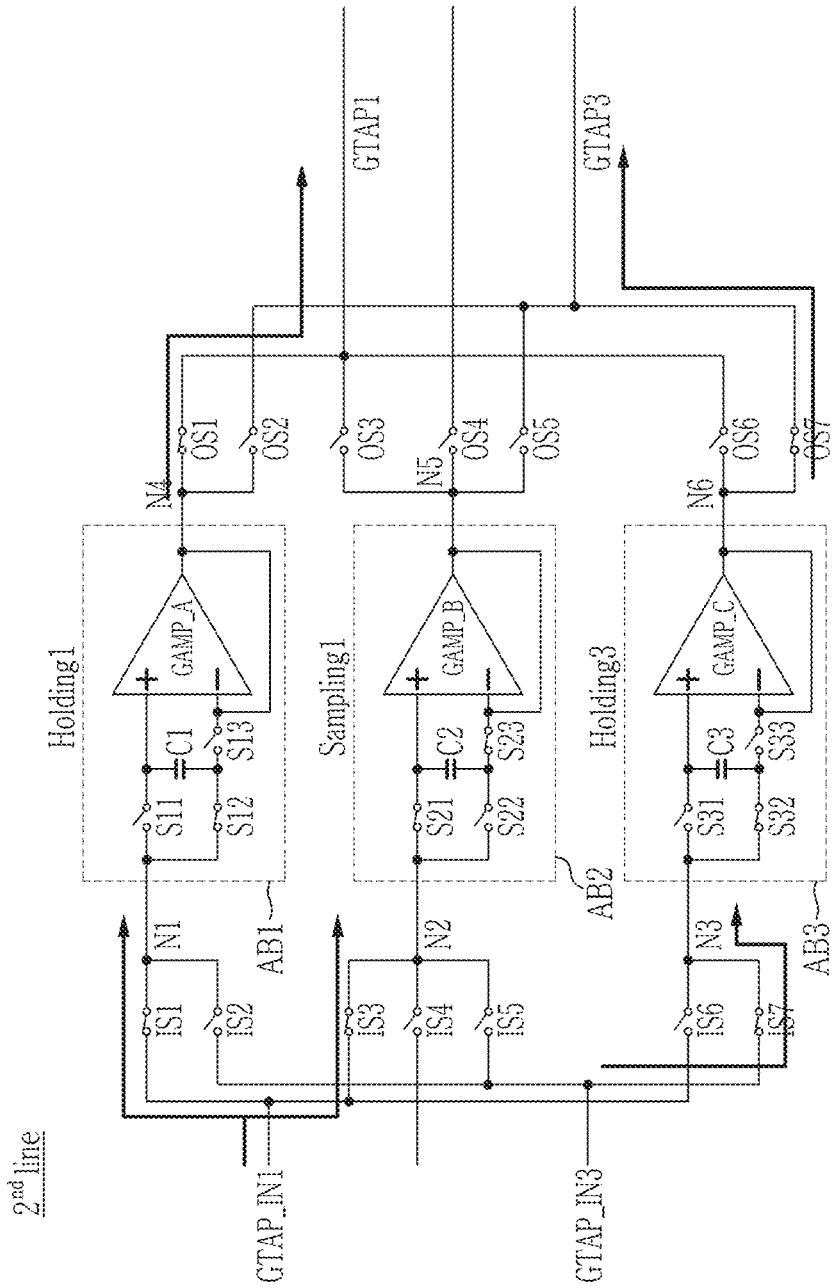

FIG. 3 to FIG. 5 illustrate circuit diagrams of a semiconductor device according to some example embodiments.

Referring to FIG. 3 and FIG. 4, a semiconductor device according to some example embodiments may include a plurality of amplifier blocks AB1 to AB3 in the gamma amplifier 22, and a plurality of tap voltages GTAP1 to GTAP3 outputted from the plurality of amplifier blocks AB1 to AB3 may be transmitted to the divider 24 to operate as described above with reference to FIG. 1 and FIG. 2.

An operation mode may be set in each of the plurality of amplifier blocks AB1 to AB3. The operation mode may include a first mode for receiving a tap input voltage and outputting the tap input voltage as a tap voltage based on the tap input voltage and on the offset of the sampled gamma amplifier, a second mode for receiving the tap input voltage and sampling the offset of the gamma amplifier, and a third mode for receiving the tap input voltage and outputting the tap voltage. As used herein, the first mode may be referred to as a holding mode, the second mode as a sampling mode, and the third mode as a normal mode.

The operation mode will be described by taking the first amplifier block AB1 as an example. The first amplifier block AB1 may include a first gamma amplifier GAMP_A and offset control switches S11 to S13. The operation mode of the first amplifier block AB1 may be set according to control of the offset control switches S11 to S13. For example, when the switches S11 and S13 are opened and the switch S12 is closed, the first amplifier block AB1 may operate in the first mode to receive the first tap input voltage GTAP_IN1, and may output the first tap voltage GTAP1 based on the first tap input voltage GTAP_IN1 and the offset of the first gamma amplifier GAMP_A stored in the capacitor C1. On the other hand, when the switches S11 and S13 are closed and the switch S12 is opened, the first amplifier block AB1 may operate in the second mode to receive the first tap input voltage GTAP_IN1, and may sample the offset of the third gamma amplifier GAMP_C to store it in the capacitor C1. In this case, the first amplifier block AB1 may not provide a tap voltage. Alternatively, when the switch S11 is closed and the switches S12 and S13 are opened, the first tap input voltage GTAP_IN1 may be provided as the first tap voltage GTAP1 as it is. The above description may be equally applied to the second amplifier block AB2 and the third amplifier block AB3.

A plurality of input terminal switches IS1 to IS7 and a plurality of output terminal switches OS1 to OS7 may be provided in the gamma amplifier 22. The plurality of input terminal switches IS1 to IS7 may divide the tap input voltages GTAP_IN1 to GTAP_IN3 to the plurality of amplifier blocks AB1 to AB3, and the plurality of output terminal switches OS1 to OS7 may transmit the plurality of amplifier blocks AB1 to AB3 to the divider 24.

As shown in FIG. 3, the semiconductor device according to various example embodiments may operate all of the plurality of amplifier blocks AB1 to AB3 in the third mode. In this case, offset removal of the gamma amplifier is not performed, and three amplifier blocks AB1 to AB3 may be used to output three tap voltages GTAP1 to GTAP3.

The plurality of input terminal switches IS1 to IS7 may apply the first tap input voltage GTAP_IN1, the second tap input voltage GTAP_IN2, and the third tap input voltage GTAP_IN3 to the first amplifier block AB1 to the third amplifier block AB3, respectively. For example, the input terminal switches IS1, IS4, and IS7 are in a closed state, and may apply the first tap input voltage GTAP_IN1, the second tap input voltage GTAP_IN2, and the third tap input voltage GTAP_IN3 to the nodes N1, N2, and N3, respectively.

All of the first amplifier blocks AB1 to AB3 may operate in the third mode to provide the first tap input voltage GTAP_IN1, the second tap input voltage GTAP_IN2, and the third tap input voltage GTAP_IN3 applied to the nodes N1, N2, and N3 to the nodes N4, N5, and N6 as the first tap voltage GTAP1, the second tap voltage GTAP2, and the third tap voltage GTAP3.

The plurality of output terminal switches OS1 to OS7 may transmit the first tap voltage GTAP1, the second tap voltage GTAP2, and the third tap voltage GTAP3 to the divider 24. For example, the output terminal switches OS1, OS4, and OS7 are in a closed state, and may transmit the first tap voltage GTAP1, the second tap voltage GTAP2, and the third tap voltage GTAP3 applied to the nodes N4, N5, and N6 to the taps VGMA3, VGMA4, and VGMA5 of the divider 24.

The semiconductor device according to various example embodiments may provide a function of removing the offset of the gamma amplifier as described later with reference to FIG. 4 to FIG. 6, and may be useful when applied to products in which an offset constraint condition of an actual gamma amplifier is not strict. Instead of using the offset removing function, one gamma amplifier is used per tap, so that more taps may be used than when the offset removing function is enabled, and characteristics such as gamma glitch and/or crosstalk pattern may be improved or excellent. Alternatively or additionally, as described above with reference to FIG. 1, since the operations of the plurality of amplifier blocks AB1 to AB3, the plurality of input terminal switches IS1 to IS7, and the plurality of output terminal switches OS1 to OS7 may be switched according to the control of the driving controller 10, flexible product application may be realized by enabling or disabling the offset removing function as needed in an environment in which the offset constraint condition is strict and in an alternative environment in which the offset constraint condition is not strict.

Meanwhile, as shown in FIG. 4 to FIG. 6, the semiconductor device according to various example embodiments may operate all of the plurality of amplifier blocks AB1 to AB3 in the first or second mode. In this case, the offset removal of the gamma amplifier is performed, and three amplifier blocks AB1 to AB3 may be used to output two tap voltages GTAP1 and GTAP3.

FIG. 4 illustrates an operation of the semiconductor device according to various example embodiments in a first period among a plurality of periods. Here, the plurality of periods may be provided for a data signal to be applied while at least one of a plurality of gate lines G1 to Gm is selected, respectively. The plurality of input terminal switches IS1 to IS7 may apply the first tap input voltage GTAP_IN1 and the third tap input voltage GTAP_IN3 to the first amplifier block AB1 to the third amplifier block AB3, respectively. For example, the input terminal switches IS1, IS5, and IS7 are in a closed state, and may apply the first tap input voltage GTAP_IN1 to the node 1 and the third tap input voltage GTAP_IN3 to the nodes N2 and N3, respectively.

The first amplifier block AB1 may operate in the first mode to receive the first tap input voltage GTAP_IN1 applied to the node N1, and may provide an output based on the first tap input voltage GTAP_IN1 and the offset of the sampled first gamma amplifier GAMP_A to the node N4 as the first tap voltage GTAP1. Here, since the first amplifier block AB1 performs a holding operation on the first tap input voltage GTAP_IN1, FIG. 4 labels the first amplifier block AB1 as "Holding1".

The second amplifier block AB2 may also operate in the first mode to receive the third tap input voltage GTAP_IN3 applied to the node N2, and may provide an output based on the third tap input voltage GTAP_IN3 and the offset of the sampled second gamma amplifier GAMP_B to the node N5 as the third tap voltage GTAP3. Here, since the second amplifier block AB2 performs a holding operation on the third tap input voltage GTAP_IN3, FIG. 4 labels the second amplifier block AB2 as "Holding3".

The third amplifier block AB3 may operate in the second mode to receive the third tap input voltage GTAP_IN3 applied to the node N3, and may sample the offset of the third gamma amplifier GAMP_C to a capacitor C3. In this case, the third amplifier block AB3 may not provide a tap voltage to the node N6. Here, since the third amplifier block AB3 performs a sampling operation on the third tap input voltage GTAP_IN3, FIG. 4 labels the third amplifier block "Sampling3".

The plurality of output terminal switches OS1 to OS7 may transmit the first tap voltage GTAP1 and the third tap voltage GTAP3 to the divider 24. For example, the output terminal switches OS1 and OS5 are in a closed state, and may transmit the first tap voltage GTAP1 and the third tap voltage GTAP3 applied to the nodes N4 and N5 to the tap of the divider 24.

Next, FIG. 5 illustrates an operation of the semiconductor device according to various example embodiments during a second period after the first period among the plurality of periods.

During the second period, the input terminal switch IS3 is switched to the closed state and the input terminal switch IS5 is switched to the opened state, so that the third tap input voltage GTAP_IN3 is not applied to the node N2, while the first tap input voltage GTAP_IN1 is applied thereto.

During the second period, the operation of the second amplifier block AB2 may be switched from the first mode to the second mode. Accordingly, the second amplifier block AB2 may operate in the second mode to receive the first tap input voltage GTAP_IN1 applied to the node N2, and may sample the offset of the second gamma amplifier GAMP_B to a capacitor C2. In this case, the second amplifier block AB2 may not provide a tap voltage to the node N5. Here, since the second amplifier block AB2 performs a sampling operation on the first tap input voltage GTAP_IN1, FIG. 5 labels the second amplifier block AB2 as "Sampling1".

During the second period, the operation of the third amplifier block AB2 may be switched from the second mode to the first mode. Accordingly, the third amplifier block AB3 may operate in the first mode to receive the third tap input voltage GTAP_IN3 applied to the node N3, and may provide an output based on the third tap input voltage GTAP_IN3 and the offset of the sampled third gamma amplifier GAMP_C to the node N6 as the third tap voltage GTAP3. Here, since the third amplifier block AB3 performs a holding operation on the third tap input voltage GTAP_IN3, FIG. 5 labels the third amplifier block AB3 as "Holding3".

During the second period, the output terminal switch OS7 is switched to the closed state and the output terminal switch OS5 is switched to the opened state, so that the output of the second amplifier block AB2 is not transmitted to the divider 24, while the output of the third amplifier block AB3 applied to the node N6 may be transmitted to the divider 24 as the third tap voltage GTAP3.

Since the gamma amplifier will or must provide a gamma voltage for every period, when the gamma amplifier operates in a mode for sampling the offset, it may not be able to provide a tap voltage during the corresponding operation. A method of performing the sampling operation between a data line and a next data line or between a frame and a next frame may be considered, but it may be difficult to meet or partially meet the time constraint to sufficiently perform the sampling operation.

According to various example embodiments, during the first period, when the third amplifier block AB3 operates in the sampling mode to not provide the tap voltage, the second amplifier block AB2 may operate in the holding mode to remove the offset of the second gamma amplifier GAMP_B sampled in the previous period (that is, the period before the first period) from the third tap input voltage GTAP_IN3 to provide it as the third tap voltage GTAP3, so that it may be possible to ensure provision of the tap voltage while performing a sampling operation every period.

Alternatively or additionally, according to some example embodiments, only three amplifier blocks (for example, three gamma amplifiers) are used to output two tap voltages while ensuring the sampling operation and the provision of the tap voltages every period. For example, in order to output three tap voltages, only one of three amplifier blocks operates in the sampling mode for one period (one line), and the remaining two thereof operate in the holding mode to provide two tap voltages.

In this method, compared to the method (for example, four gamma amplifiers are required to provide two tap voltages) of using two gamma amplifiers (for example, the gamma amplifier that performs the offset sampling and the gamma amplifier that performs the holding) per one tap voltage to ensure the sampling operation and provision of the tap voltage in every period, and since the proportion of the sampling time in the overall operation time is relatively reduced, the number of the gamma amplifiers that occupy a space and/or consume a current without providing the tap voltage may be reduced, so that an area occupied by the device/or and power consumption may be reduced.

FIG. 6 illustrates a drawing for explaining an operation of a semiconductor device according to various example embodiments.

Referring to FIG. 6, during the first period (represented by lines in the drawing), the first amplifier block AB1 may operate in the holding mode with respect to the first tap input voltage GTAP_IN1 (indicated as "H1"), the second amplifier block AB2 may operate in the holding mode with respect to the third tap input voltage GTAP_IN3 (indicated as "H3"), and the third amplifier block AB3 may operate in the sampling mode with respect to the third tap input voltage GTAP_IN3 (indicated by "S3"). Accordingly, with respect to the third tap input voltage GTAP_IN3, while the third amplifier block AB3 performs the offset sampling to not provide the tap voltage, the second amplifier block AB2 may provide the tap voltage (indicated by a dotted line box).

During the second period after the first period, the first amplifier block AB1 may maintain the operation in the holding mode, the second amplifier block AB2 may operate in the sampling mode with respect to the first tap input voltage GTAP_IN1 (indicated as "S1"), and the third amplifier block AB3 may operate in the holding mode with respect to the third tap input voltage GTAP_IN3. Accordingly, with respect to the first tap input voltage GTAP_IN1, while the second amplifier block AB2 performs the offset sampling to not provide the tap voltage, the first amplifier block AB1 may provide the tap voltage (indicated by a dotted line box).

During the third period after the second period, the third amplifier block AB3 may maintain the operation in the holding mode, the first amplifier block AB1 may operate in the sampling mode with respect to the first tap input voltage GTAP_IN1, and the second amplifier block AB2 may operate in the holding mode with respect to the first tap input voltage GTAP_IN1. Accordingly, with respect to the third tap input voltage GTAP_IN3, while the first amplifier block AB1 performs the offset sampling to not provide the tap voltage, the third amplifier block AB3 may provide the tap voltage (indicated by a dotted line box).

Thereafter, the operation method for the first to third periods may also be applied for the fourth to seventh periods, and a detailed description with respect to the fourth to seventh periods will be omitted.

The first amplifier block AB1 may perform "2 lines hold" in which the operation in the holding mode is maintained for the first and second periods. In this case, while the first amplifier block AB1 maintains the operation in the holding mode for two periods, the second amplifier block AB2 and the third amplifier block AB3 may be alternately switched between the holding mode and the sampling mode to operate. Similarly, the third amplifier block AB3 may perform "2 lines hold" for the second and third periods, and the second amplifier block AB2 may perform "2 lines hold" for the third and fourth periods. Accordingly, a ratio of the holding time and the sampling time may be 2:1.

Figure 7:
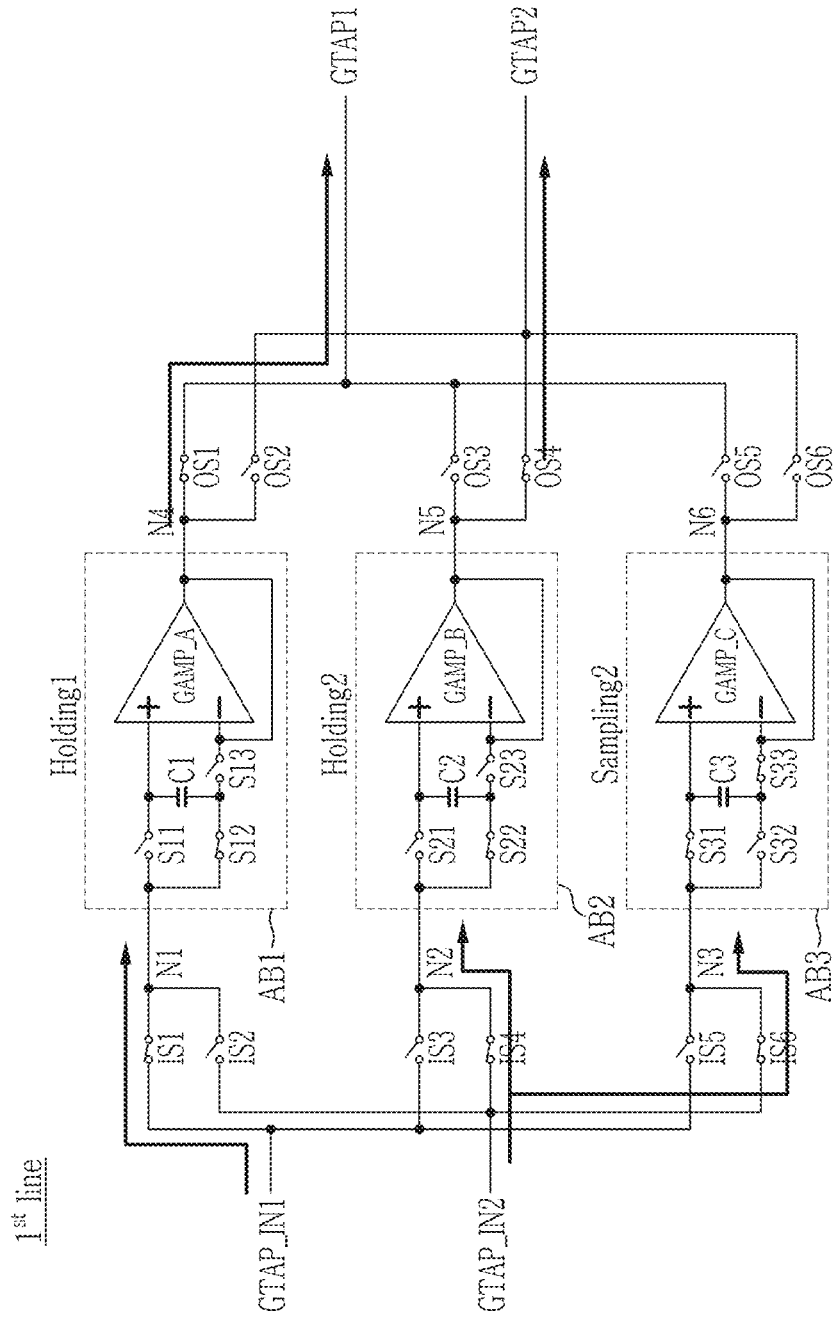
FIG. 7 and FIG. 8 illustrate circuit diagrams of a semiconductor device according to some example embodiments.
Figure 8:
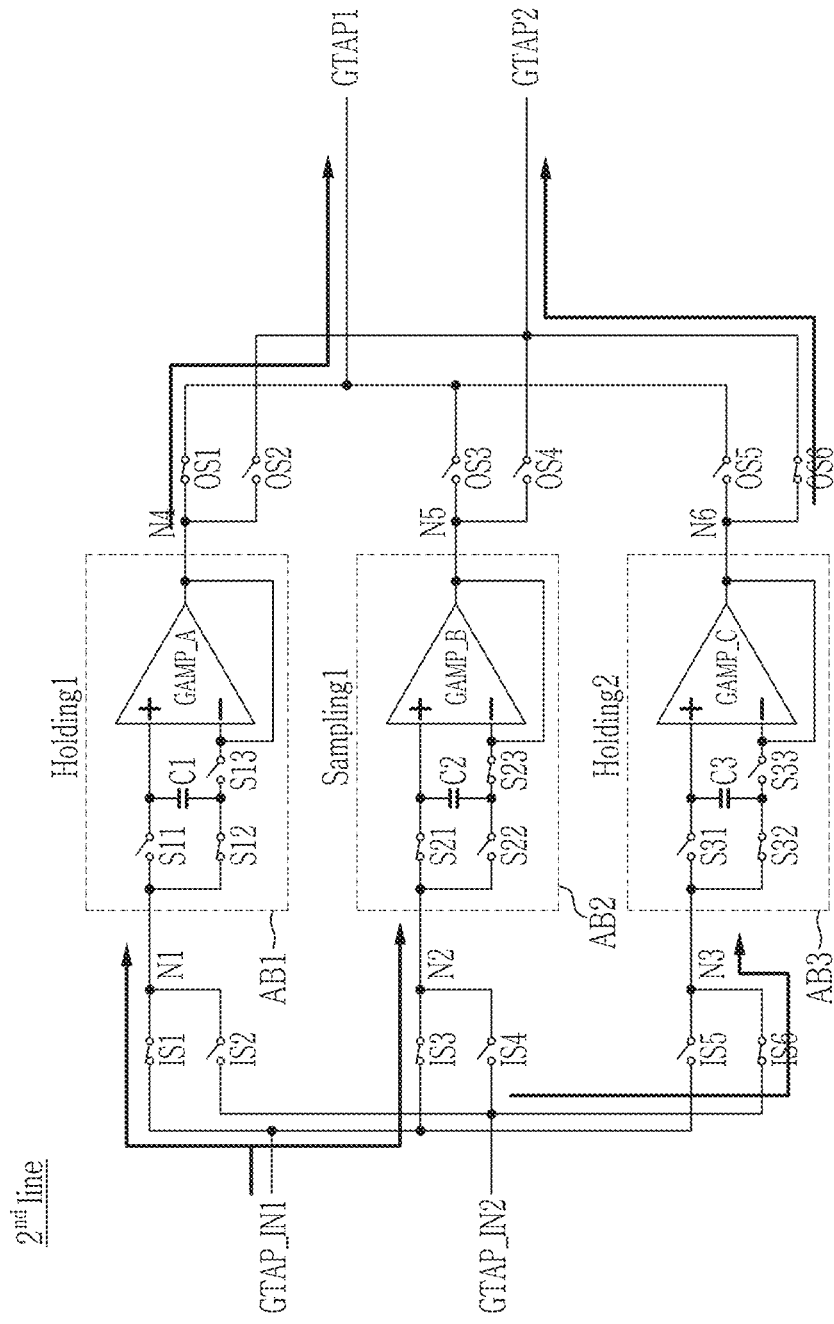

FIG. 7 and FIG. 8 illustrate circuit diagrams of a semiconductor device according to some example embodiments.

Referring to FIG. 7 and FIG. 8, in the semiconductor device according to some example embodiments, the plurality of amplifier blocks AB1 to AB3 operate only in the first mode and the second mode and do not operate in the third mode, unlike some example embodiments described above with reference to FIG. 3 to FIG. 6. In addition, the semiconductor device of the present embodiment is different from some example embodiments described above with reference to FIG. 3 to FIG. 6 in that the number of the input terminal switches IS1 to IS6 and the number of the output terminal switches OS1 to OS6 are reduced. The semiconductor device according to the present embodiment may be usefully applied to a product designed to operate only in an offset removing mode while reducing the number of switches without considering use in an environment in which the offset constraint conditions are not strict.

FIG. 7 illustrates the operation of the semiconductor device according to the present embodiment during the first period, wherein the input terminal switches IS1, IS4, and IS6 are in a closed state, the first tap input voltage GTAP_IN1 may be applied to the node N1, and the second tap input voltage GTAP_IN2 may be applied to the nodes N2 and N3, respectively.

The first amplifier block AB1 may operate in the first mode to receive the first tap input voltage GTAP_IN1 applied to the node N1, and may provide an output based on the first tap input voltage GTAP_IN1 and the offset of the sampled first gamma amplifier GAMP_A to the node N4 as the first tap voltage GTAP1.

The second amplifier block AB2 may also operate in the first mode to receive the second tap input voltage GTAP_IN2 applied to the node N2, and may provide an output based on the second tap input voltage GTAP_IN2 and the offset of the sampled second gamma amplifier GAMP_B to the node N5 as the second tap voltage GTAP2. Here, since the second amplifier block AB2 performs a holding operation on the second tap input voltage GTAP_IN2, it is indicated as "Holding2" in FIG. 7.

The third amplifier block AB3 may operate in the second mode to receive the second tap input voltage GTAP_IN2 applied to the node N3, and may sample the offset of the third gamma amplifier GAMP_C to a capacitor C3. In this case, the third amplifier block AB3 may not provide a tap voltage to the node N6. Here, since the third amplifier block AB3 performs a sampling operation on the second tap input voltage GTAP_IN2, it is indicated as "Sampling2" in FIG. 7.

The output terminal switches OS1 and OS4 are in a closed state, and may transmit the first tap voltage GTAP1 and the second tap voltage GTAP2 applied to the nodes N4 and N5 to the tap of the divider 24.

Next, FIG. 8 illustrates an operation of the semiconductor device according to the present embodiment during the second period after the first period.

During the second period, the input terminal switch IS3 is switched to the closed state and the input terminal switch IS4 is switched to the opened state, so that the second tap input voltage GTAP_IN2 is not applied to the node N2, while the first tap input voltage GTAP_IN1 is applied thereto.

During the second period, the operation of the second amplifier block AB2 may be switched from the first mode to the second mode. Accordingly, the second amplifier block AB2 may operate in the second mode to receive the first tap input voltage GTAP_IN1 applied to the node N2, and may sample the offset of the second gamma amplifier GAMP_B. In this case, the second amplifier block AB2 may not provide a tap voltage to the node N5.

During the second period, the operation of the third amplifier block AB2 may be switched from the second mode to the first mode. Accordingly, the third amplifier block AB3 may operate in the first mode to receive the second tap input voltage GTAP_IN2 applied to the node N3, and may provide an output based on the second tap input voltage GTAP_IN2 and the offset of the sampled third gamma amplifier GAMP_C to the node N6 as the second tap voltage GTAP2.

During the second period, the output terminal switch OS6 is switched to the closed state, and the output terminal switch OS5 is switched to the opened state, so that the output of the second amplifier block AB2 is not transmitted to the divider 24, while the output of the third amplifier block AB3 applied to the node N6 may be transmitted to the divider 24 as the second tap voltage GTAP2.

FIG. 9 illustrates a drawing for explaining an operation of a semiconductor device according to some example embodiments.

Referring to FIG. 9, during the first period, while the third amplifier block AB3 does not provide the tap voltage by performing the offset sampling on the second tap input voltage GTAP_IN2, the second amplifier block AB2 may provide the tap voltage; during the second period after the first period, while the second amplifier block AB2 does not provide the tap voltage by performing the offset sampling on the first tap input voltage GTAP_IN1, the first amplifier block AB1 may provide the tap voltage; and during the third period after the second period, while the first amplifier block AB1 does not provide the tap voltage by performing the offset sampling on the third tap input voltage GTAP_IN3, the third amplifier block AB3 may provide the tap voltage. A more detailed operation may be referred to in the description described above with respect to FIG. 6.

Thereafter, the operation method for the first to third periods may also be applied for the fourth to seventh periods, and a detailed description with respect to the fourth to seventh periods will be omitted.

Figure 10:
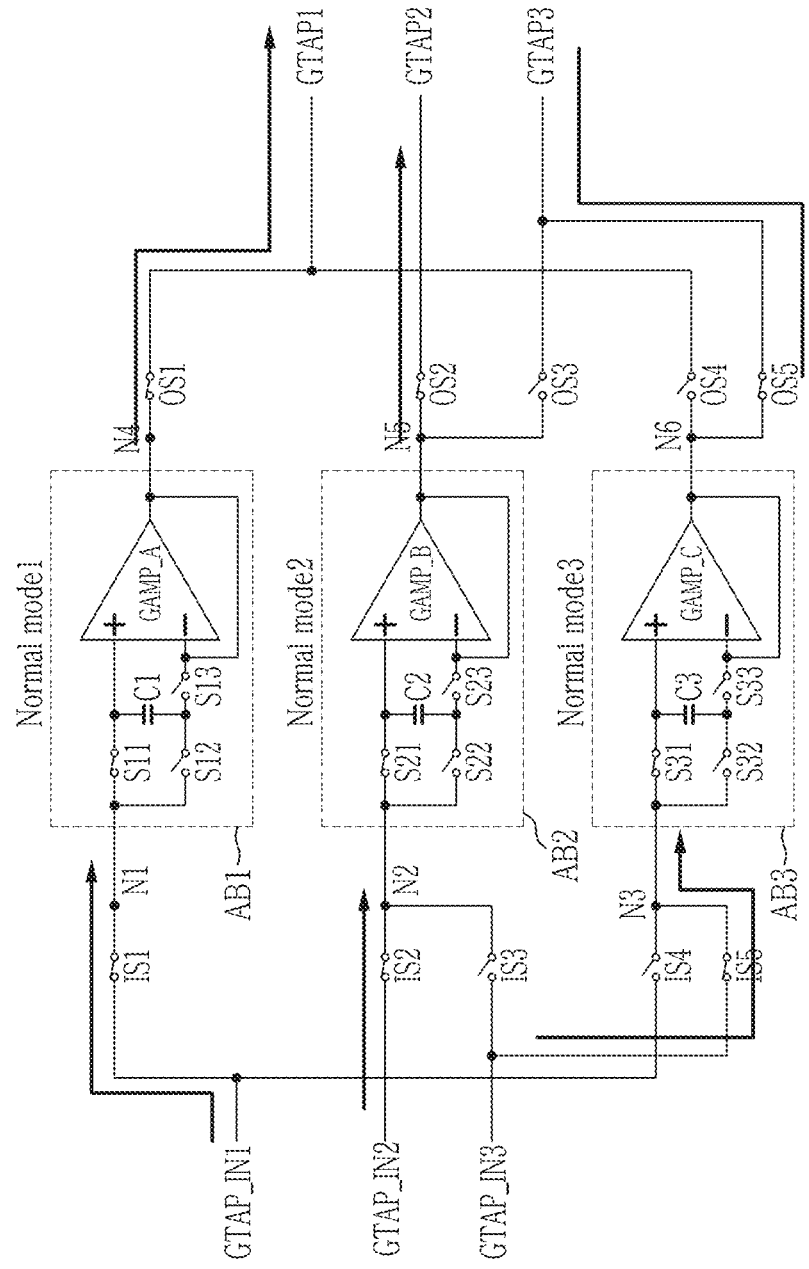
FIG. 10 to FIG. 12 illustrate circuit diagrams of a semiconductor device according to some example embodiments.
Figure 11:
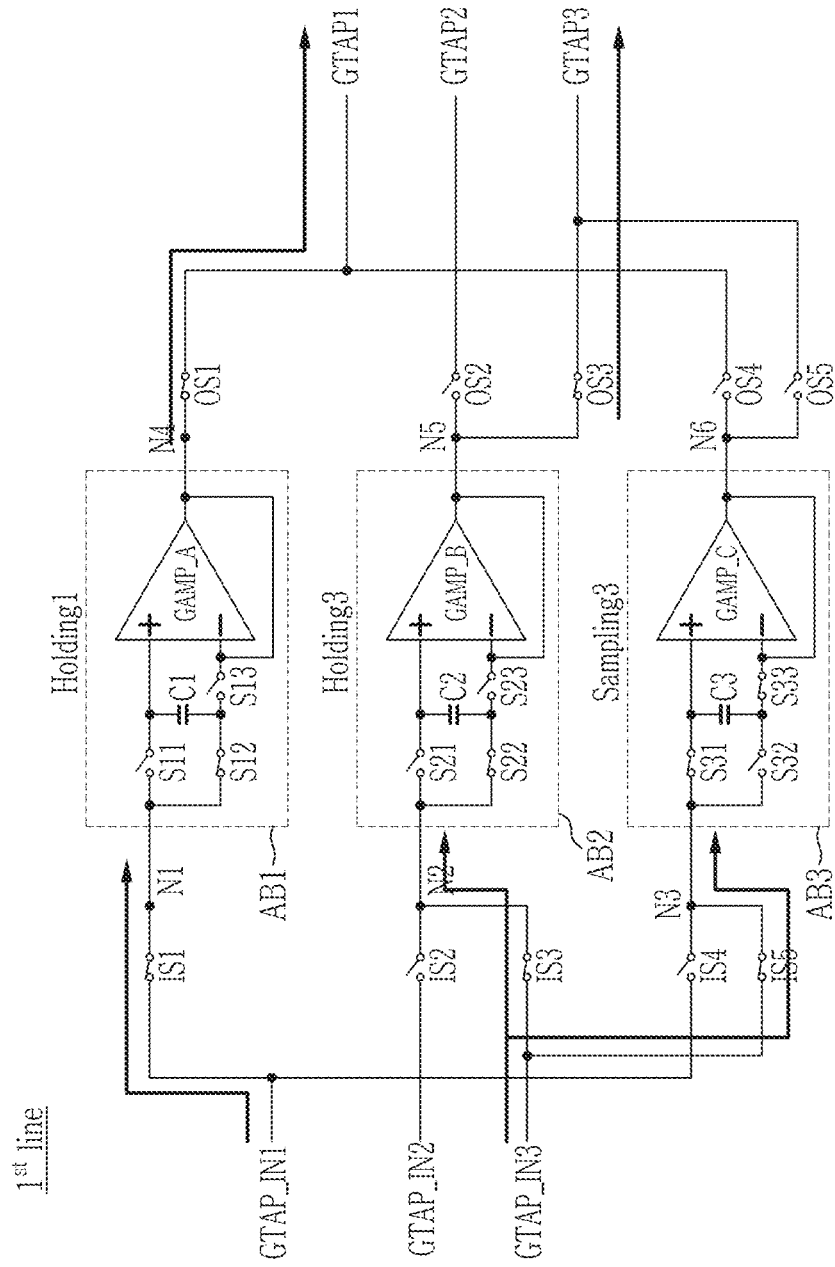
Figure 12:
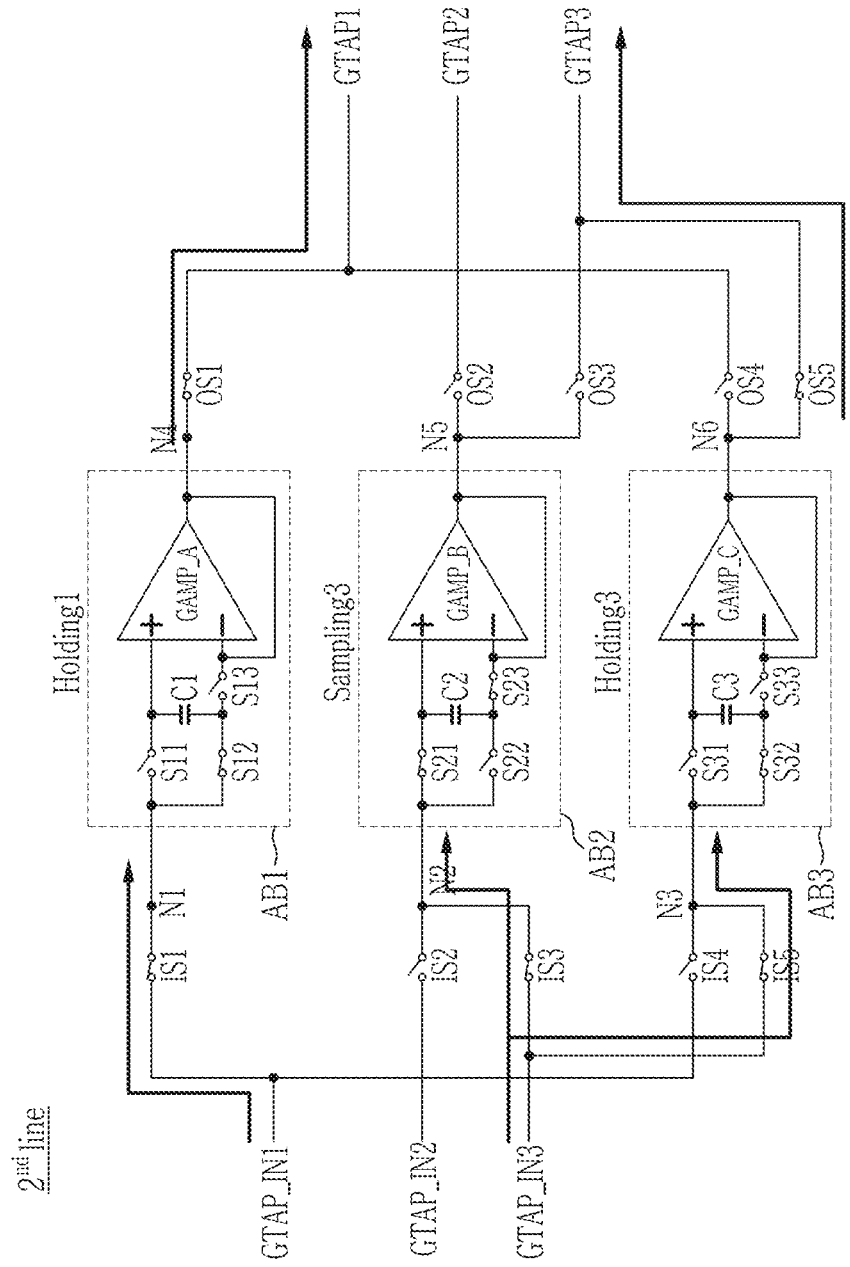

FIG. 10 to FIG. 12 illustrate circuit diagrams of a semiconductor device according to some example embodiments.

Referring to FIG. 10 and FIG. 11, a semiconductor device according to some example embodiments is different from that according to some example embodiments described above with reference to FIG. 3 in that the number of the input terminal switches IS1 to IS5 and the number of the output terminal switches OS1 to OS5 are decreased and in that when the offset removal is performed, a proportion of the sampling time in the overall operation time is relatively decreased and a proportion of the holding time is relatively increased.

As shown in FIG. 10, the semiconductor device according to the present embodiment may operate all of the plurality of amplifier blocks AB1 to AB3 in the third mode. In this case, the offset removal of the gamma amplifier is not performed, and three amplifier blocks AB1 to AB3 may be used to output three tap voltages GTAP1 to GTAP3. A more detailed operation may be referred to in the description described above with respect to FIG. 3.

Meanwhile, as shown in FIG. 11 to FIG. 13, the semiconductor device according to the present embodiment may operate all of the plurality of amplifier blocks AB1 to AB3 in the first or second mode. In this case, the offset removal of the gamma amplifier is performed, and three amplifier blocks AB1 to AB3 may be used to output two tap voltages GTAP1 and GTAP3.

The input terminal switches IS1, IS3, and IS5 are in a closed state, and may apply the first tap input voltage GTAP_IN1 to the node 1 and the third tap input voltage GTAP_IN3 to the nodes N2 and N3, respectively.

The first amplifier block AB1 may operate in the first mode to receive the first tap input voltage GTAP_IN1 applied to the node N1, and may provide an output based on the first tap input voltage GTAP_IN1 and the offset of the sampled first gamma amplifier GAMP_A to the node N4 as the first tap voltage GTAP1.

The second amplifier block AB2 may also operate in the first mode to receive the third tap input voltage GTAP_IN3 applied to the node N2, and may provide an output based on the third tap input voltage GTAP_IN3 and the offset of the sampled second gamma amplifier GAMP_B to the node N5 as the third tap voltage GTAP3.

The third amplifier block AB3 may operate in the second mode to receive the third tap input voltage GTAP_IN3 applied to the node N3, and may sample the offset of the third gamma amplifier GAMP_C. In this case, the third amplifier block AB3 may not provide a tap voltage to the node N6.

The output terminal switches OS1 and OS3 are in a closed state, and may transmit the first tap voltage GTAP1 and the third tap voltage GTAP3 applied to the nodes N4 and N5 to the tap of the divider 24.

Next, FIG. 12 illustrates an operation of the semiconductor device according to the present embodiment during a second period after the first period.

During the second period, the operation of the second amplifier block AB2 may be switched from the first mode to the second mode. Accordingly, the second amplifier block AB2 may operate in the second mode to receive the third tap input voltage GTAP_IN3 applied to the node N2, and may sample the offset of the second gamma amplifier GAMP_B. In this case, the second amplifier block AB2 may not provide a tap voltage to the node N5.

During the second period, the operation of the third amplifier block AB2 may be switched from the second mode to the first mode. Accordingly, the third amplifier block AB3 may operate in the first mode to receive the third tap input voltage GTAP_IN3 applied to the node N3, and may provide an output based on the third tap input voltage GTAP_IN3 and the offset of the sampled third gamma amplifier GAMP_C to the node N6 as the third tap voltage GTAP3.

During the second period, the output terminal switch OS5 is switched to the closed state and the output terminal switch OS3 is switched to the opened state, so that the output of the second amplifier block AB2 is not transmitted to the divider 24, while the output of the third amplifier block AB3 applied to the node N6 may be transmitted to the divider 24 as the third tap voltage GTAP3.

FIG. 13 illustrates a drawing for explaining an operation of a semiconductor device according to some example embodiments.

Referring to FIG. 13, during the first period, the first amplifier block AB1 may operate in the holding mode with respect to the first tap input voltage GTAP_IN1, the second amplifier block AB2 may operate in the holding mode with respect to the third tap input voltage GTAP_IN3, and the third amplifier block AB3 may operate in the sampling mode with respect to the third tap input voltage GTAP_IN3. Accordingly, with respect to the third tap input voltage GTAP_IN3, while the third amplifier block AB3 performs the offset sampling to not provide the tap voltage, the second amplifier block AB2 may provide the tap voltage (indicated by a dotted line box).

During the second period after the first period, the first amplifier block AB1 may maintain the operation in the holding mode, the second amplifier block AB2 may operate in the sampling mode with respect to the third tap input voltage GTAP_IN3, and the third amplifier block AB3 may operate in the holding mode with respect to the third tap input voltage GTAP_IN3. Accordingly, with respect to the third tap input voltage GTAP_IN3, while the second amplifier block AB2 performs the offset sampling to not provide the tap voltage, the third amplifier block AB3 may provide the tap voltage (indicated by a dotted line box).

During the third period after the second period, the first amplifier block AB1 may still maintain the operation in the holding mode, the second amplifier block AB2 may operate in the holding mode with respect to the third tap input voltage GTAP_IN3, and the third amplifier block AB3 may operate in the sampling mode with respect to the first tap input voltage GTAP_IN1. Accordingly, with respect to the first tap input voltage GTAP_IN1, while the third amplifier block AB3 performs the offset sampling to not provide the tap voltage, the first amplifier block AB1 may provide the tap voltage (indicated by a dotted line box).

During the fourth period after the third period, the second amplifier block AB2 may maintain the operation in the holding mode, the first amplifier block AB1 may operate in the sampling mode with respect to the first tap input voltage GTAP_IN1, and the third amplifier block AB3 may operate in the holding mode with respect to the first tap input voltage GTAP_IN1. Accordingly, with respect to the first tap input voltage GTAP_IN1, while the first amplifier block AB1 performs the offset sampling to not provide the tap voltage, the third amplifier block AB3 may provide the tap voltage (indicated by a dotted line box).

Thereafter, the operation method for the first to fourth periods may also be applied for the fifth to seventh periods, and a detailed description with respect to the fifth to seventh periods will be omitted.

The first amplifier block AB1 may perform "3 lines hold" in which the operation in the holding mode is maintained for the first to third periods. In this case, while the first amplifier block AB1 maintains the operation in the holding mode for three periods, the second amplifier block AB2 and the third amplifier block AB3 may be alternately switched between the holding mode and the sampling mode to operate. Similarly, the third amp block AB3 may perform "3 lines hold" for the third period to the fifth period. Accordingly, a ratio of the holding time and the sampling time may be 3:1.

Figure 14:
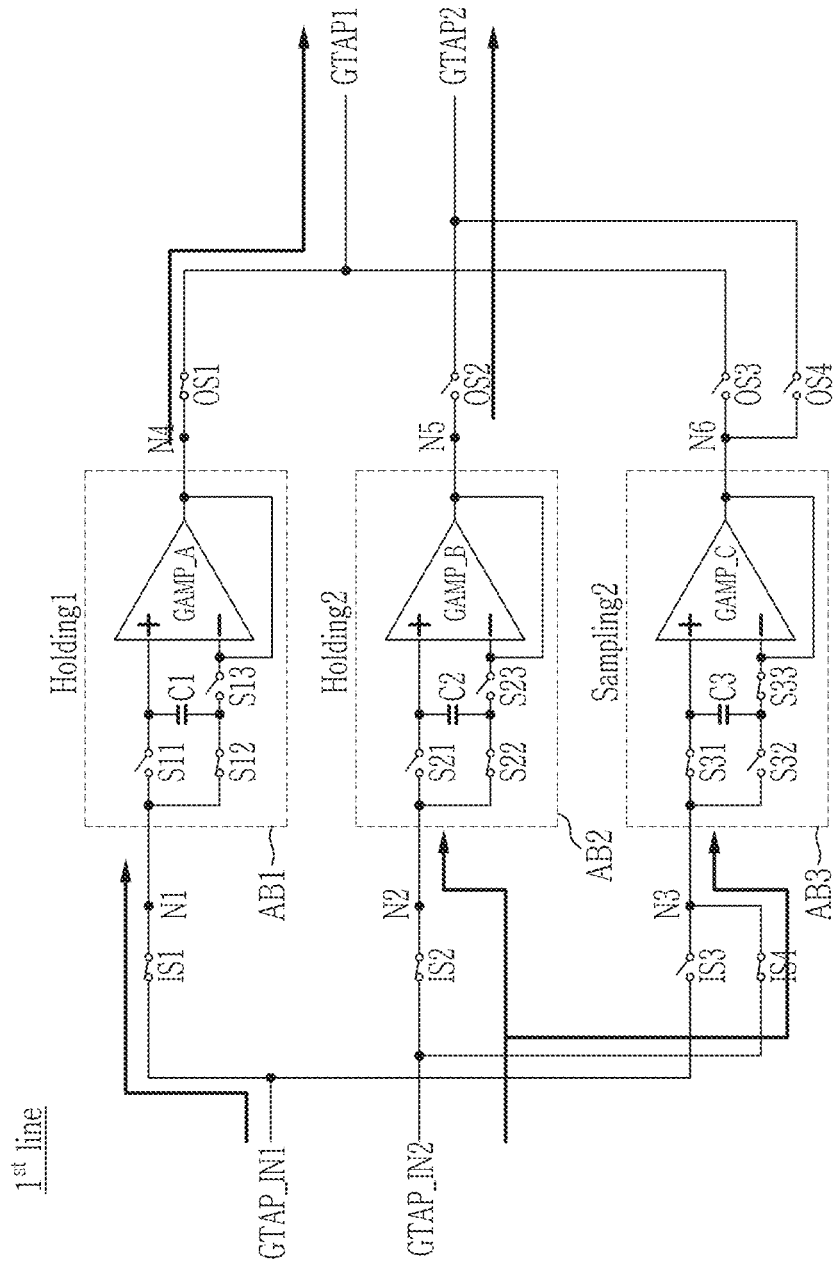
FIG. 14 and FIG. 15 illustrate circuit diagrams of a semiconductor device according to some example embodiments.
Figure 15:
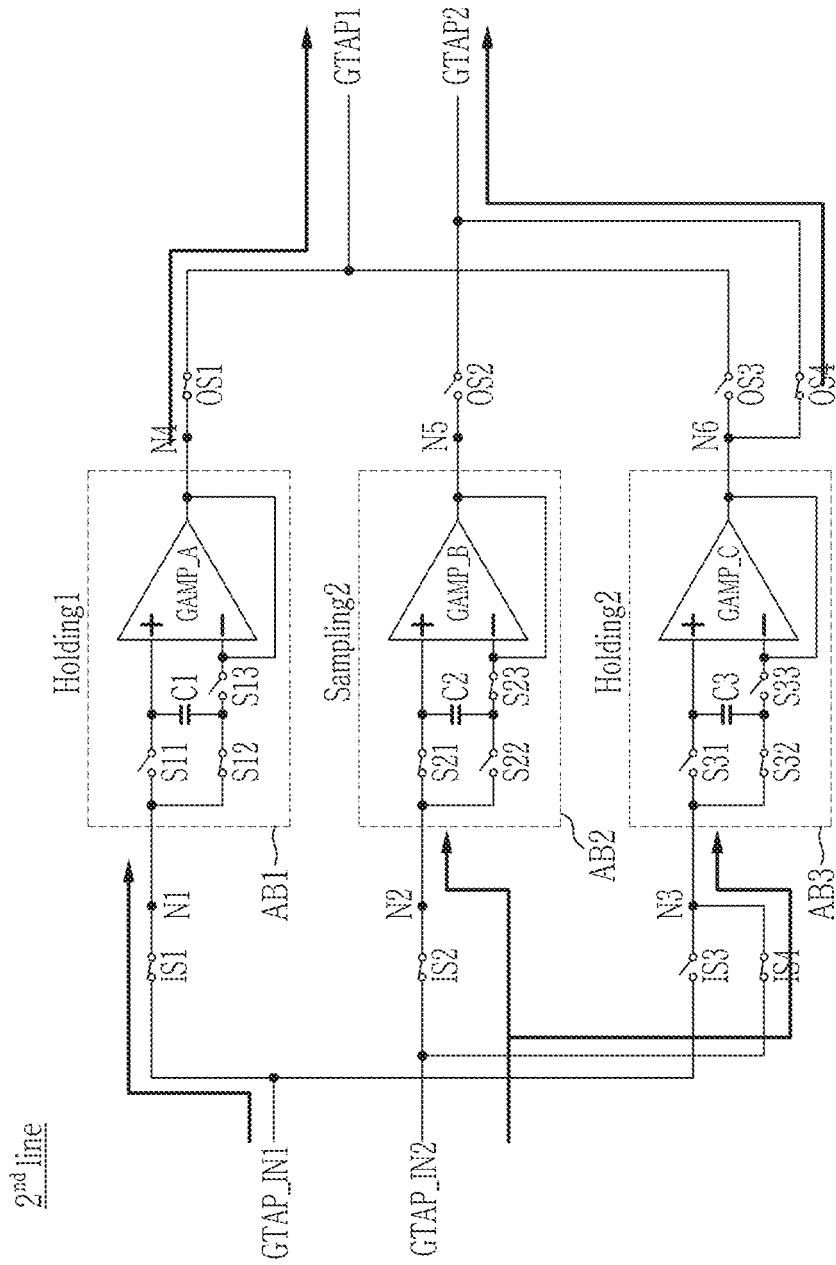

FIG. 14 and FIG. 15 illustrate circuit diagrams of a semiconductor device according to some example embodiments.

Referring to FIG. 14 and FIG. 15, in the semiconductor device according to some example embodiments, the plurality of amplifier blocks AB1 to AB3 operate only in the first mode and the second mode and do not operate in the third mode, unlike some example embodiments described above with reference to FIG. 10 to FIG. 13. In addition, the semiconductor device is different from various example embodiments described above with reference to FIG. 10 to FIG. 13 in that the number of the input terminal switches IS1 to IS5 and the number of the output terminal switches OS1 to OS5 are reduced.

FIG. 14 illustrates the operation of the semiconductor device according to the present embodiment during the first period, wherein the input terminal switches IS1, IS4, and IS6 are in a closed state, the first tap input voltage GTAP_IN1 may be applied to the node N1, and the second tap input voltage GTAP_IN2 may be applied to the nodes N2 and N3, respectively.

The first amplifier block AB1 may operate in the first mode to receive the first tap input voltage GTAP_IN1 applied to the node N1, and may provide an output based on the first tap input voltage GTAP_IN1 and the offset of the sampled first gamma amplifier GAMP_A to the node N4 as the first tap voltage GTAP1.

The second amplifier block AB2 may also operate in the first mode to receive the second tap input voltage GTAP_IN2 applied to the node N2, and may provide an output based on the second tap input voltage GTAP_IN2 and the offset of the sampled second gamma amplifier GAMP_B to the node N5 as the second tap voltage GTAP2.

The third amplifier block AB3 may operate in the second mode to receive the second tap input voltage GTAP_IN2 applied to the node N3, and may sample the offset of the third gamma amplifier GAMP_C. In this case, the third amplifier block AB3 may not provide a tap voltage to the node N6.

The output terminal switches OS1 and OS2 are in a closed state, and may transmit the first tap voltage GTAP1 and the second tap voltage GTAP2 applied to the nodes N4 and N5 to the tap of the divider 24.

Next, FIG. 15 illustrates an operation of the semiconductor device according to the present embodiment during a second period after the first period.

During the second period, the operation of the second amplifier block AB2 may be switched from the first mode to the second mode. Accordingly, the second amplifier block AB2 may operate in the second mode to receive the second tap input voltage GTAP_IN2 applied to the node N2, and may sample the offset of the second gamma amplifier GAMP_B. In this case, the second amplifier block AB2 may not provide a tap voltage to the node N5.

During the second period, the operation of the third amplifier block AB2 may be switched from the second mode to the first mode. Accordingly, the third amplifier block AB3 may operate in the first mode to receive the second tap input voltage GTAP_IN2 applied to the node N3, and may provide an output based on the second tap input voltage GTAP_IN2 and the offset of the sampled third gamma amplifier GAMP_C to the node N6 as the second tap voltage GTAP2.

During the second period, the output terminal switch OS4 is switched to the closed state, and the output terminal switch OS2 is switched to the opened state, so that the output of the second amplifier block AB2 is not transmitted to the divider 24, while the output of the third amplifier block AB3 applied to the node N6 may be transmitted to the divider 24 as the second tap voltage GTAP2.

FIG. 16 illustrates a drawing for explaining an operation of a semiconductor device according to some example embodiments.

Referring to FIG. 16, during the first period, while the third amplifier block AB3 does not provide the tap voltage by performing offset sampling with respect to the second tap input voltage GTAP_IN2, the second amplifier block AB2 may provide the tap voltage; during the second period after the first period, while the second amplifier block AB2 does not provide the tap voltage by performing the offset sampling with respect to the third tap input voltage GTAP_IN3, the third amplifier block AB3 may provide the tap voltage; during the third period after the second period, while the third amplifier block AB3 does not provide the tap voltage by performing offset sampling with respect to the first tap input voltage GTAP_IN1, the first amplifier block AB1 may provide the tap voltage; and during the fourth period after the third period, while the first amplifier block AB1 does not provide the tap voltage by performing offset sampling with respect to the first tap input voltage GTAP_IN1, the third amplifier block AB3 may provide the tap voltage. A more detailed operation may be referred to in the description described above with respect to FIG. 13.

Figure 17:
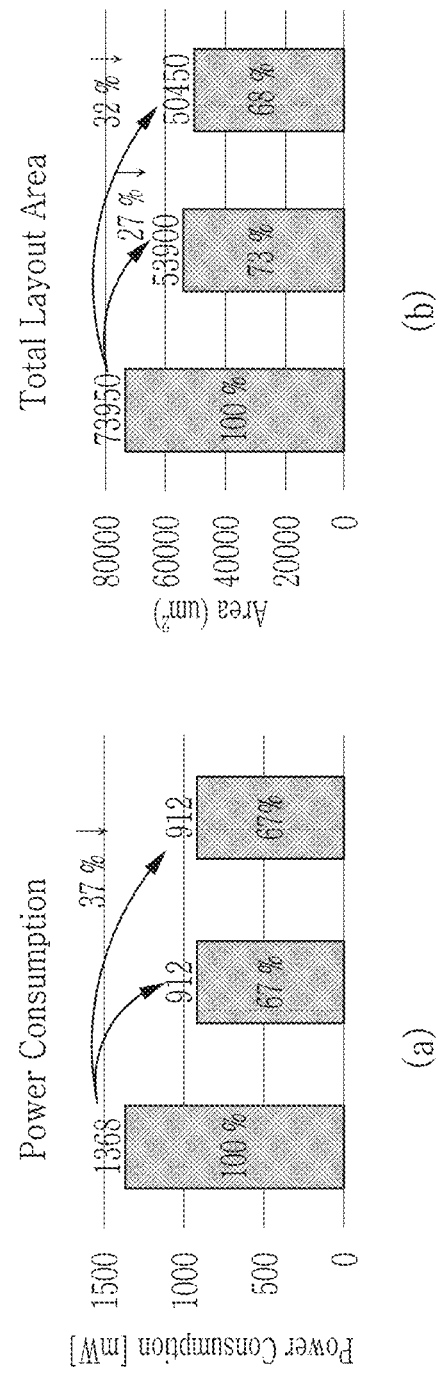

FIG. 17 and FIG. 18 illustrate drawings for explaining a semiconductor device according to various example embodiments.

Referring to FIG. 17 and FIG. 18, "Ping-pong AZ" may correspond to a method (for example, four gamma amplifiers are required or used to provide two tap voltages) of using two gamma amplifiers, a gamma amplifier performing offset sampling and a gamma amplifier performing holding, per one tap voltage; "Circulated AZ1" may correspond to various example embodiments described with reference to FIG. 3 to FIG. 9 using three gamma amplifiers per two tap voltages; and "Circulated AZ2" may correspond to various example embodiments described with reference to FIG. 10 to FIG. 16 using three gamma amplifiers per two tap voltages.

The power consumption and area were reduced to 67% and 73% for "Circulated AZ1" and 67% and 68% for "Circulated AZ2" compared to "Ping-pong AZ", while the offset level was maintained at 0.1 mV, which is a level comparable to "Ping-pong AZ".

In order to provide N tap voltages (N is a natural number), 2N gamma amplifiers may be required for "Ping-pong AZ" and N+1 gamma amplifiers may be required for "Circulated AZ1" and "Circulated AZ2"; and the ratio of the holding time and the sampling time may be 1:1 for "Ping-pong AZ", N:1 for "Circulated AZ1", and 2N-1:1 for "Circulated AZ2".

When only the offset removal function is implemented, the number of the output terminal switches required to provide N tap voltages may be 2N for "Ping-pong AZ", (N+1)*N for "Circulated AZ1", and 2N for "Circulated AZ2"; and when the function to provide one additional tap voltage without performing the offset removal is also implemented, it may be 2N+1 for "Ping-pong AZ", (N+1)*N+1 for "Circulated AZ1", and 2N+1 for "Circulated AZ2".

"Circulated AZ1" requires a larger number of the output terminal switches than "Circulated AZ2", but the proportion of the holding time thereof is smaller than that of "Circulated AZ2"; and in the case of "Circulated AZ2", the proportion of the holding time thereof is greater than that of "Circulated AZ1", but the number of the required output terminal switches thereof is relatively small. Accordingly, in an environment in which it is a priority to control the proportion of the holding time to not be large enough to cause distortion in the sampled offset value, "Circulated AZ1" may be selected by sufficiently implementing the number of output terminal switches, and in an environment in which area minimization or reduction is a priority and the constraint condition of the holding time ratio is not strict, "Circulated AZ2" with the minimized or reduced number of the output terminal switches may be selected.

From this, the semiconductor device according to some example embodiments may include: the plurality of output terminal switches that transmit outputs of N amplifier blocks among the N+1 amplifier blocks to the divider 24, wherein the N+1 amplifier blocks operate in the holding mode for outputting the tap voltages based on the tap input voltage and the offset of the sampled gamma amplifier or in the sampling mode for sampling the offset of the gamma amplifier based on the tap input voltage, in order to provide N tap voltages (N is a natural number greater than or equal to 2); and the driving control unit 10 that controls the operation mode of the N+1 amplifier blocks so that, among the N+1 amplifier blocks, N amplifier blocks operate in the holding mode and only one amplifier block operates in the sampling mode for the plurality of periods, and the amplifier blocks operating in the second mode may be different from each other for the first period and the second period among the plurality of periods.

In some example embodiments corresponding to "Circulated AZ1", a plurality of output terminal switches are (N+1)*N or (N+1)*N+1, and a ratio between the holding time and the sampling time of the N+1 amplifier blocks may be N:1.

In some example embodiments corresponding to "Circulated AZ1", a plurality of output terminal switches are 2N or 2N+1, and a ratio between the holding time and the sampling time of the N+1 amplifier blocks may be 2N-1:1.

Figure 19:
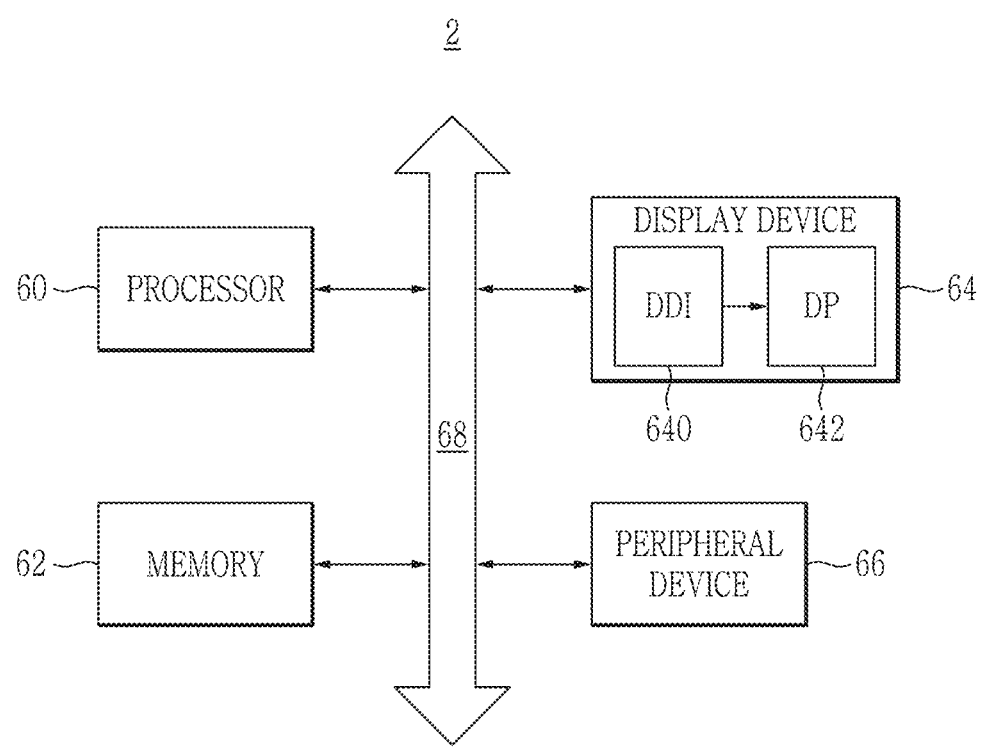
FIG. 19 illustrates a drawing for explaining a semiconductor system according to some example embodiments.

FIG. 19 illustrates a drawing for explaining a semiconductor system according to some example embodiments.

Referring to FIG. 19, a semiconductor system 2 according to some example embodiments may include a processor 60, a memory 62, a display device 64, and a peripheral device 66 that are electrically connected to a system bus 68.

The processor 60 controls input and output of data of the memory 62, the display device 64, and the peripheral device 66, and may perform image processing of image data transmitted between the corresponding devices.

The display device 64 may include a DDI 640 and a display panel 642, and the display device 65 may store image data applied through the system bus 68 in a frame memory included in the DDI 640 and then display it on the display panel 642. The DDI 640 and the display device 64 may be semiconductor devices according to various embodiments.

The peripheral device 66 may be or may include a device that converts a moving image or a still image captured by a camera, a scanner, or a webcam into an electrical signal. The image data obtained through the peripheral device 66 may be stored in the memory 62, or may be displayed on the display panel 642 in real time.

The memory 62 may include a volatile memory such as a dynamic random access memory (DRAM) and/or a non-volatile memory such as a flash memory. The memory 62 may be configured with one or more of a DRAM, a phase-change random access memory (PRAM), a magnetic random access memory (MRAM), a resistive random access memory (ReRAM), a ferroelectric random access memory (FRAM), a NOR flash memory, a NAND flash memory, and a fusion flash memory (for example, a memory in which a static random access memory (SRAM) buffer, a NAND flash memory, and a NOR interface logic are combined). The memory 62 may store image data obtained from the peripheral device 66 or an image signal processed by the processor 60.

The semiconductor system 2 may be provided in a mobile electronic product such as a smart phone, but is not limited thereto, and may be provided in various electronic products that display images.

Figure 20:
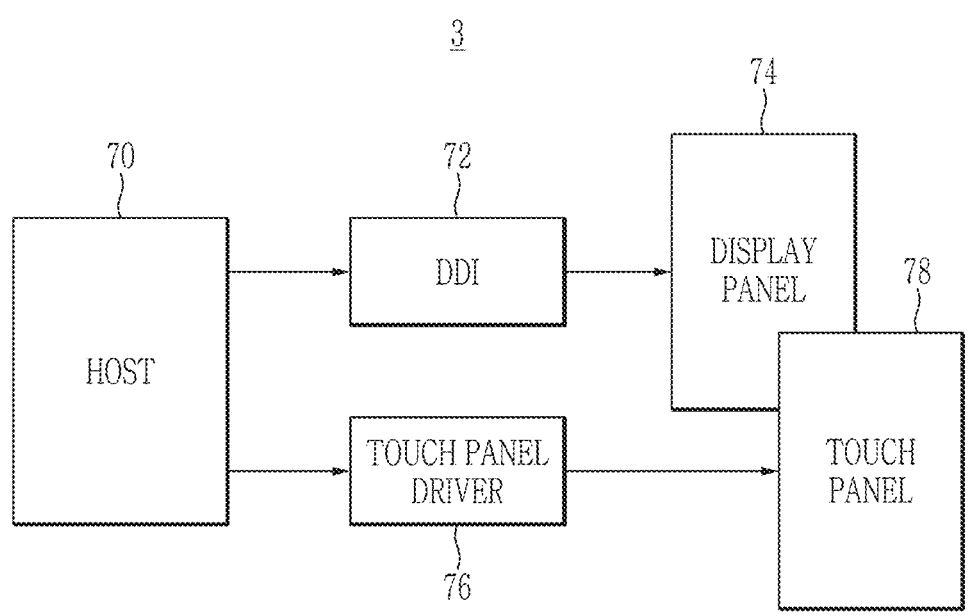
FIG. 20 illustrates a drawing for explaining a semiconductor system according to some example embodiments.

FIG. 20 illustrates a drawing for explaining a semiconductor system according to some example embodiments.

Referring to FIG. 20, a semiconductor system 3 according to some example embodiments may include a host 70, a DDI 72, a display panel 74, a touch panel driver 76, and a touch panel 78.

The host 70 may receive data and/or instructions from a user, and control the DDI 72 and the touch panel driver 76 based on the received data or instructions. The DDI 72 may drive the display panel 74 under the control of the host 70. The DDI 72 may include a semiconductor device according to various embodiments.

The touch panel 78 may be provided to overlap the display panel 74. The touch panel driver 76 may receive data sensed by the touch panel 78 to transmit it to the host 70.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been described in connection with what is presently considered to be practical example embodiments, it is to be understood that inventive concepts are not limited to the disclosed embodiments. On the contrary, various descriptions of example embodiments are intended to cover various modifications and/or equivalent arrangements included within the spirit and scope of the appended claims.

What is claimed is:

1. A semiconductor device comprising:
a first amplifier block that includes a first gamma amplifier, the first amplifier block configured to operate in a holding mode for a first period of a plurality of periods to output a first tap voltage based on a first tap input voltage and an offset of the first gamma amplifier sampled;
a second amplifier block that includes a second gamma amplifier, the second amplifier block configured to operate in the holding mode during the first period to output a second tap voltage based on a second tap input voltage and an offset of the second gamma amplifier sampled;
a third amplifier block that includes a third gamma amplifier, the third amplifier block configured to operate in a sampling mode during the first period to sample an offset of the third gamma amplifier based on the second tap input voltage;
a plurality of input terminal switches that are configured to divide the first tap input voltage and the second tap input voltage to the first amplifier block, the second amplifier block, and the third amplifier block; and
a plurality of output terminal switches that are configured to transmit the first tap voltage and the second tap voltage from at least some of the first amplifier block, the second amplifier block, and the third amplifier block to a divider.

2. The semiconductor device of claim 1, wherein the semiconductor device is configured to operate such that the plurality of periods are provided for a data signal to be applied while at least one of a plurality of gate lines is selected, respectively.

3. The semiconductor device of claim 1, wherein the plurality of input terminal switches are configured to apply the first tap input voltage, the second tap input voltage, and a third tap input voltage to the first amplifier block to the third amplifier block, respectively; the first to third amplifier blocks are configured to operate in a normal mode to output the first tap input voltage, the second tap input voltage, and the third tap input voltage as the first tap voltage, the second tap voltage, and the third tap voltage; and the plurality of output terminal switches are configured to transmit the first tap voltage, the second tap voltage, and the third tap voltage to the divider.

4. The semiconductor device of claim 1, wherein the second amplifier block is configured to sample an offset of the second gamma amplifier based on the first tap input voltage by being switched to the sampling mode during a second period after the first period among the plurality of periods, and the third amplifier block is configured to output the second tap voltage based on the second tap input voltage and an offset of the third gamma amplifier sampled by being switched to the holding mode during the second period.

5. The semiconductor device of claim 4, wherein during the second period, the plurality of input terminal switches are configured to stop applying the second tap input voltage to the second amplifier block and to apply the first tap input voltage.

6. The semiconductor device of claim 4, wherein the first amplifier block is configured to sample an offset of the first gamma amplifier based on the second tap input voltage by being switched to the sampling mode during a third period after the second period among the plurality of periods, and the second amplifier block outputs the first tap voltage based on the first tap input voltage and an offset of the second gamma amplifier sampled by being switched to the holding mode during the third period.

7. The semiconductor device of claim 4, wherein the first amplifier block is configured to maintain an operation in the holding mode during the first period and the second period, and the second amplifier block and the third amplifier block are configured to switch operations between the holding mode and the sampling mode during the first and second periods.

8. The semiconductor device of claim 4, wherein the second amplifier block is configured to output the second tap voltage based on the second tap input voltage and the sampled offset of the second gamma amplifier by being switched to the holding mode during a third period after the second period among the plurality of periods, and the third amplifier block is configured to sample the offset of the third gamma amplifier based on the first tap input voltage by being switched to the sampling mode during the third period.

9. The semiconductor device of claim 8, wherein during the third period, the plurality of input terminal switches are configured to stop applying the second tap input voltage to the third amplifier block and to apply the first tap input voltage.

10. The semiconductor device of claim 8, wherein the first amplifier block is configured to sample the offset of the first gamma amplifier based on a third tap input voltage by being switched to the sampling mode during a fourth period after the third period among the plurality of periods, and the third amplifier block is configured to output the second tap voltage based on the first tap input voltage and an offset of the third gamma amplifier sampled by being switched to the holding mode during the fourth period.

11. The semiconductor device of claim 8, wherein the first amplifier block is configured to maintain an operation in the holding mode during the first period, the second period, and the third period, and the second amplifier block and the third amplifier block are configured to switch operations between the holding mode and the sampling mode during the first and second periods.

12. A semiconductor device comprising:
a plurality of amplifier blocks operating in a holding mode that is configured to output a tap voltage based on a tap input voltage and on an offset of a gamma amplifier sampled or in a sampling mode that samples the offset of the gamma amplifier based on the tap input voltage; and a driving controller that is configured to control an operation mode of the plurality of amplifier blocks, wherein during a first period of a plurality of periods and during a second period after the first period, the driving controller is configured to maintain an operation of a first amplifier block of the plurality of amplifier blocks in the holding mode, and alternately switch operations of a second amplifier block and a third amplifier block of the plurality of amplifier blocks in the holding mode and the sampling mode.

13. The semiconductor device of claim 12, wherein the driving controller is configured to control the second amplifier block to output the tap voltage while the third amplifier block operates in the sampling mode during the first period, and is configured to control the first amplifier block to output the tap voltage while the second amplifier block operates in the sampling mode during the second period.

14. The semiconductor device of claim 12, wherein the driving controller is configured to control the second amplifier block to output the tap voltage while the third amplifier block operates in the sampling mode during the first period, and is configured to control the third amplifier block to output the tap voltage while the second amplifier block operates in the sampling mode during the second period.

15. The semiconductor device of claim 12, wherein during the first period and the second period of the plurality of periods and a third period after the second period, the driving controller is configured to maintain an operation of the first amplifier block of the plurality of amplifier blocks in the holding mode, and alternately switch operations of the second amplifier block and the third amplifier block of the plurality of amplifier blocks in the holding mode and the sampling mode.

16. A semiconductor device comprising:
in order to provide N tap voltages (N is a natural number equal to or greater than 2), N+1 amplifier blocks are configured to operate in a holding mode that outputs a tap voltage based on a tap input voltage and an offset of a gamma amplifier sampled or in a sampling mode that samples the offset of the gamma amplifier based on the tap input voltage;

a plurality of output terminal switches that are configured to transmit outputs of N amplifier blocks among the N+1 amplifier blocks to a divider; and a driving controller that is configured to control operation modes of the N+1 amplifier blocks so that, every plurality of periods, N amplifier blocks among the N+1 amplifier blocks operate in the holding mode and only one amplifier block thereof operates in the sampling mode, wherein the amplifier blocks that are configured to operate in the holding mode are different from each other during a first period of the plurality of periods and a second period after the first period.

17. The semiconductor device of claim 16, wherein the number of the plurality of output terminal switches is (N+1)*N.

18. The semiconductor device of claim 16, wherein the number of the plurality of output terminal switches is 2N.

19. The semiconductor device of claim 16, wherein a ratio of a holding time and a sampling time of the N+1 amplifier blocks is N:1.

20. The semiconductor device of claim 16, wherein a ratio of a holding time and a sampling time of the N+1 amplifier blocks is 2N−1:1.

* * * * *